(12) United States Patent
Yoel et al.

(10) Patent No.: US 8,423,839 B2
(45) Date of Patent: Apr. 16, 2013

(54) MEMORY REPAIR SYSTEM AND METHOD

(75) Inventors: Reshef Bar Yoel, Haifa (IL); Yosef Solt, Misgav (IL); Michael Levi, Haifa (IL); Yosef Haviv, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 13/113,401

(22) Filed: May 23, 2011

(65) Prior Publication Data
US 2011/0219275 A1 Sep. 8, 2011

Related U.S. Application Data

(63) Continuation of application No. 11/869,308, filed on Oct. 9, 2007, now Pat. No. 7,949, 908.

(60) Provisional application No. 60/829,072, filed on Oct. 11, 2006.

(51) Int. Cl.
*G11C 29/00* (2006.01)
*G11C 7/00* (2006.01)

(52) U.S. Cl.
USPC ........................................... 714/710; 365/200

(58) Field of Classification Search .............. 714/711, 714/710, 718, 723, 842, 47, 8, 5, 3, 2, 1; 365/200, 201; 711/200, 202, 206, 207, 209
See application file for complete search history.

(56) References Cited

U.S. PATENT DOCUMENTS

| | | | |
|---|---|---|---|
| 5,631,868 A | 5/1997 | Termullo et al. | |
| 6,208,570 B1 * | 3/2001 | Brown et al. | 365/201 |
| 6,532,181 B2 * | 3/2003 | Saito et al. | 365/200 |
| 6,539,505 B1 * | 3/2003 | Dahn | 714/718 |
| 6,728,910 B1 | 4/2004 | Huang | |
| 7,260,758 B1 | 8/2007 | Agrawal et al. | |
| 7,437,626 B2 | 10/2008 | Chang et al. | |

OTHER PUBLICATIONS

Kawagoe, Tomoya et al; "A Built-In Self-Repair Analyzer (CRESTA) for embedded DRAMs"; ITC International Test Conference; Jan. 2000; pp. 567-574.

Ohler, Philipp et al; "An Integrated Built-In Test and Repair Approach for Memories with 2D Redundancy"; Proceedings 12th IEEE European Test Symposium, Freiburg, Germany, May 2007; 6 pages.

Ohler, Philipp et al; "Analyzing Test and Repair Times for 2D Integrated Memory Built-In Test and Repair"; Proceedings 10th IEEE Workshop on Design and Diagnostics of Electronic Circuits and Systems, Krakow, Poland, Apr. 2007; 6 pages.

Shoukourian, Samvel et al; "SoC Yield Optimization via an Embedded-Memory Test and Repair Infrastructure"; IEEE Design & Test of Computers; May-Jun. 2004; cover page and pp. 200-207.

* cited by examiner

*Primary Examiner* — Christine Tu

(57) ABSTRACT

A memory system includes an array of memory cells. The array of memory cells includes redundant memory cells. The redundant memory cells include at least two of a redundant row and a redundant column of memory cells. The repair module is configured to (i) identify at least two of a row and a column of the array of memory cells having non-operational memory cells and (ii) substitute the at least two of the row and the column of the array of memory cells with selected rows or columns of the redundant memory cells based on X predetermined sequences of substitutions. The repair module is configured to detect a failure in the array of memory cells that cannot be repaired using the X predetermined sequences of substitutions, and use an alternative repair sequence to repair the non-operational memory cells based on the detection of the failure.

20 Claims, 20 Drawing Sheets

| Combination # | 1st Failure | 2nd Failure | 3rd Failure | 4th Failure |
|---|---|---|---|---|
| 1 | Row | Row | Column | Column |
| 2 | Row | Column | Row | Column |
| 3 | Row | Column | Column | Row |
| 4 | Column | Row | Column | Row |
| 5 | Column | Row | Row | Column |
| 6 | Column | Column | Row | Row |

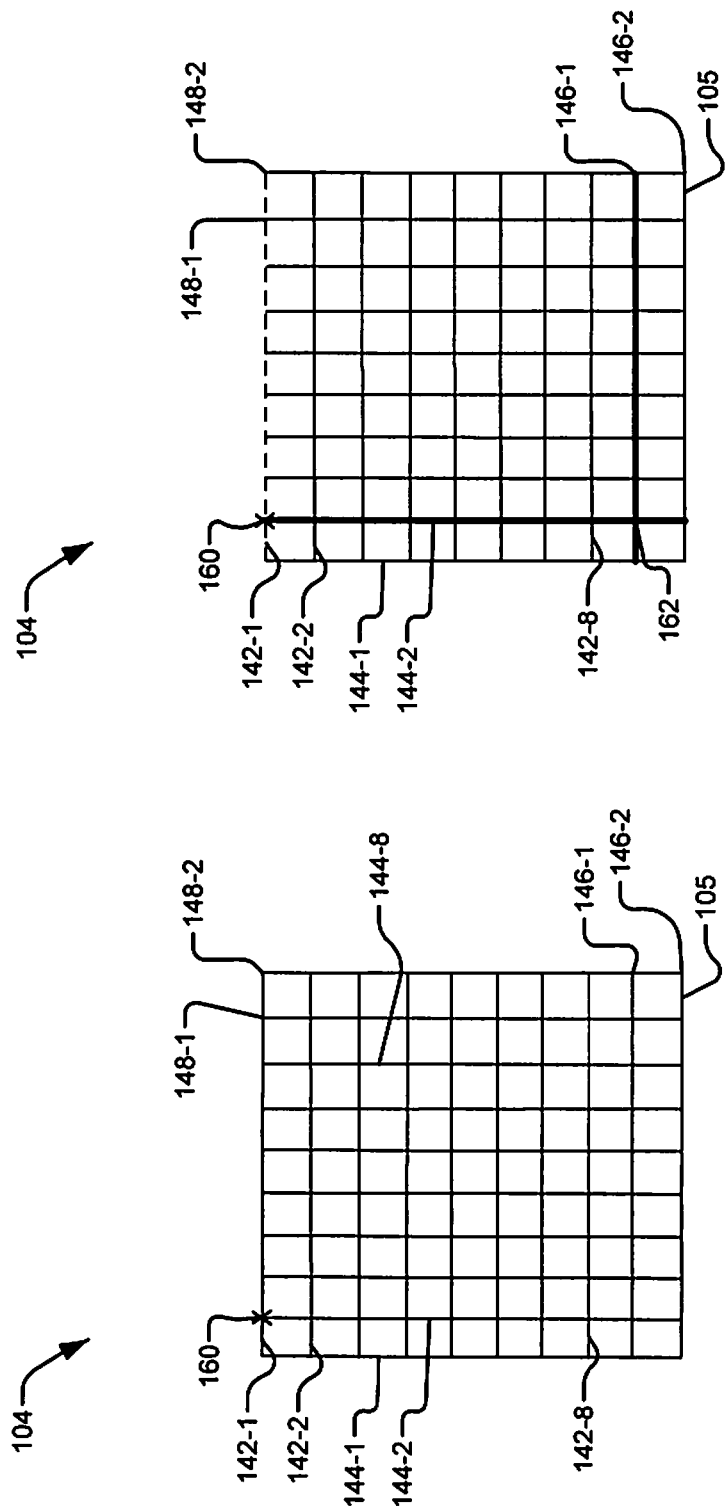

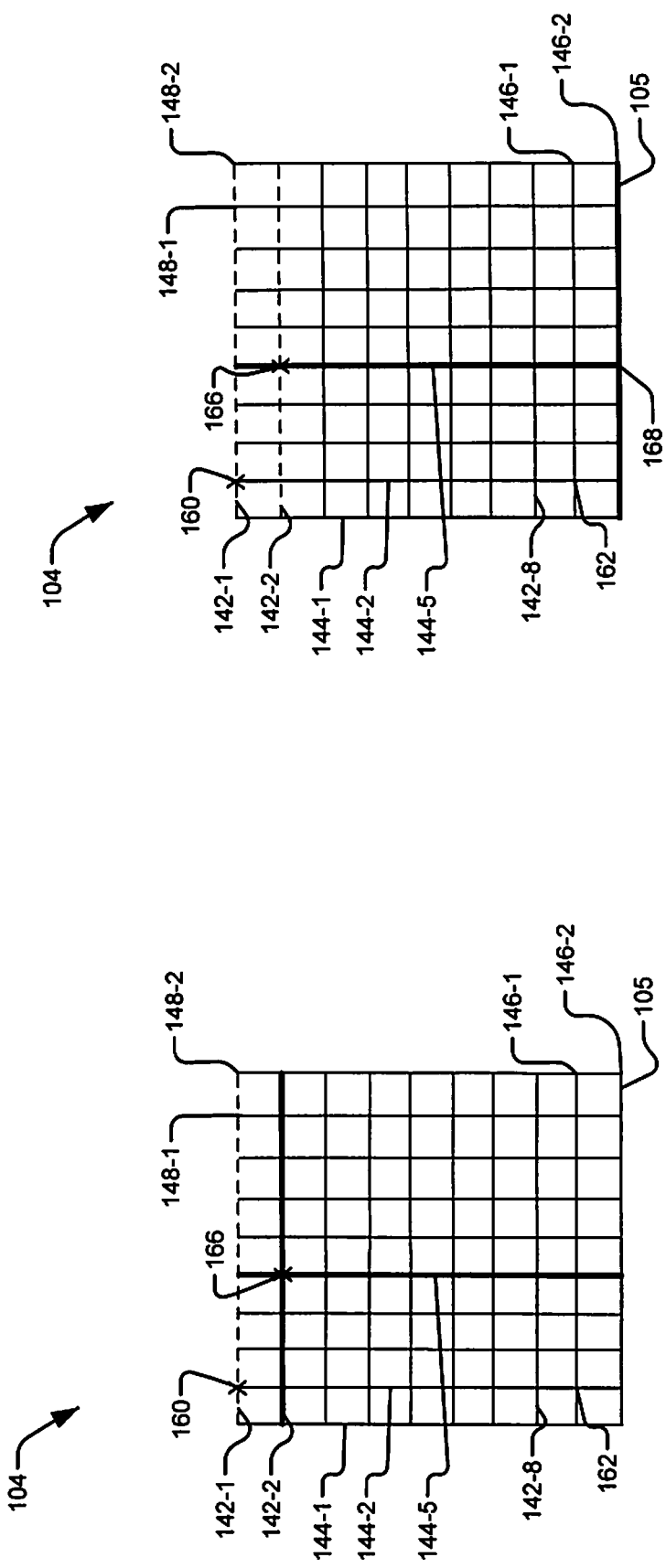

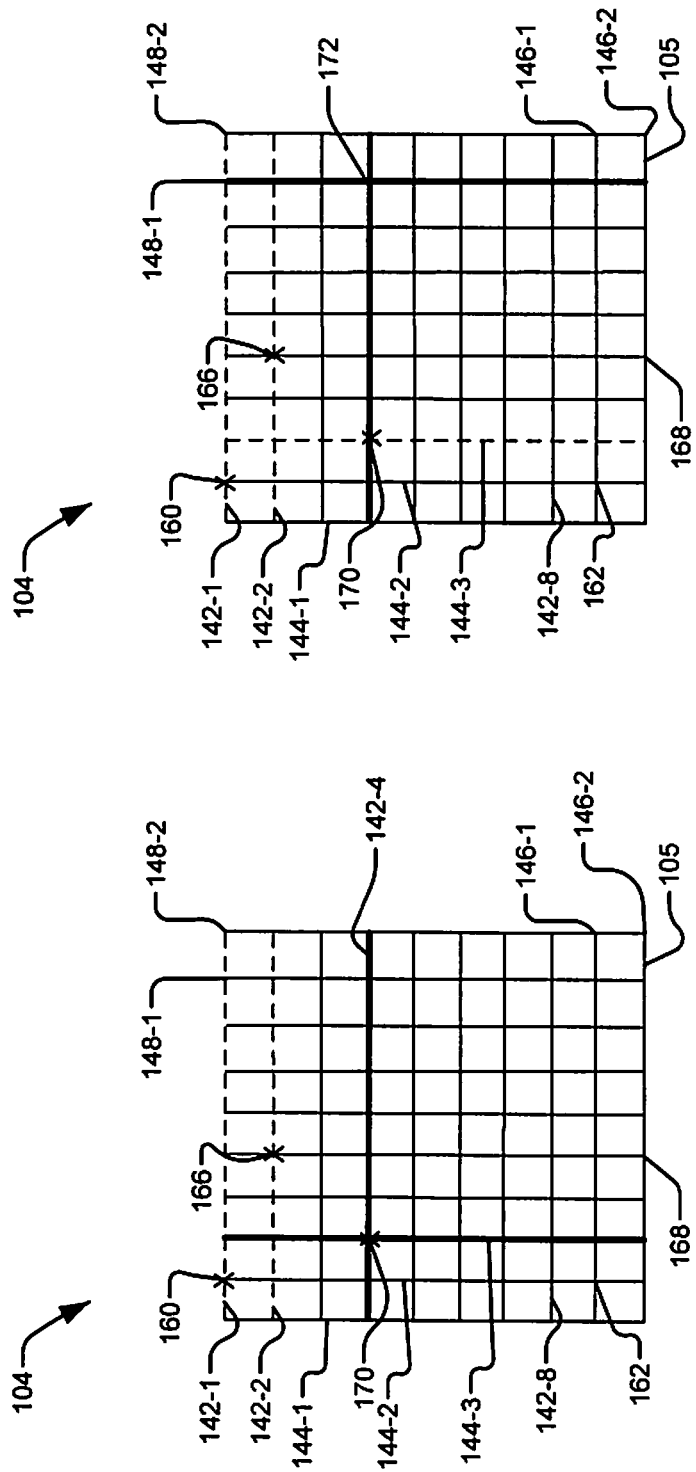

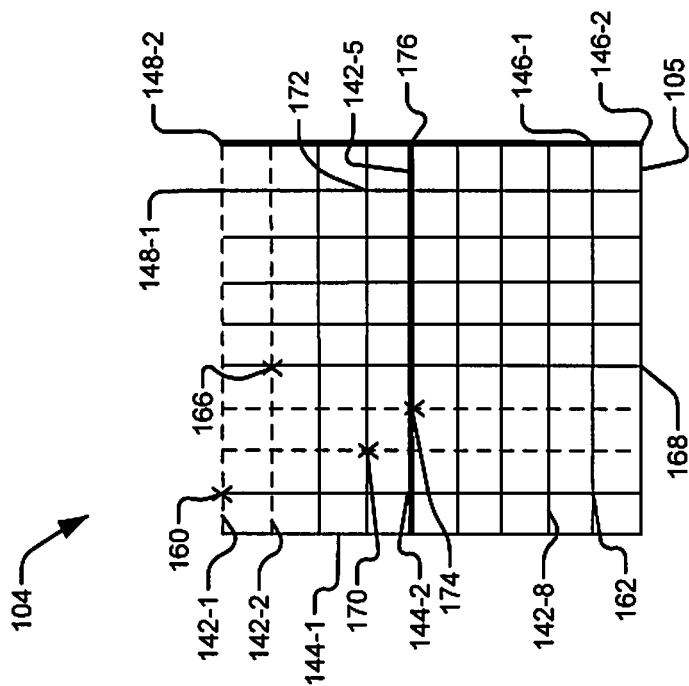
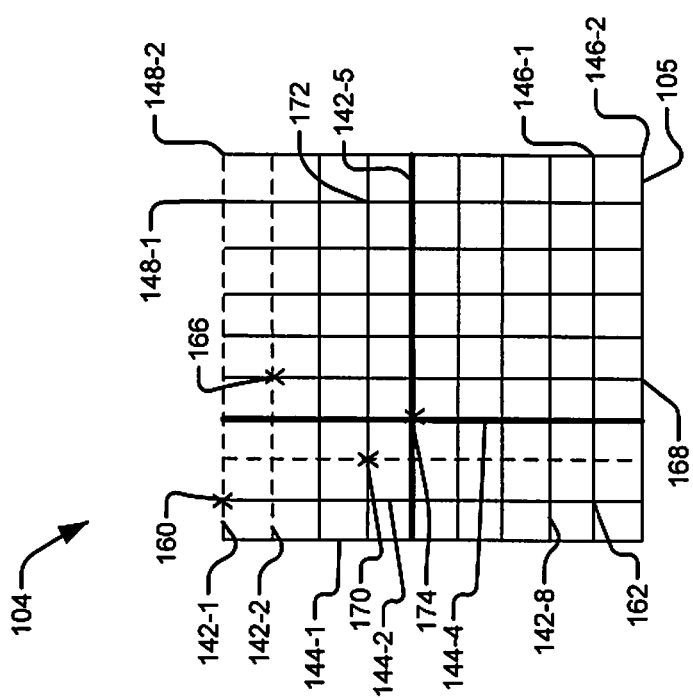
FIG. 6H
FIG. 6G

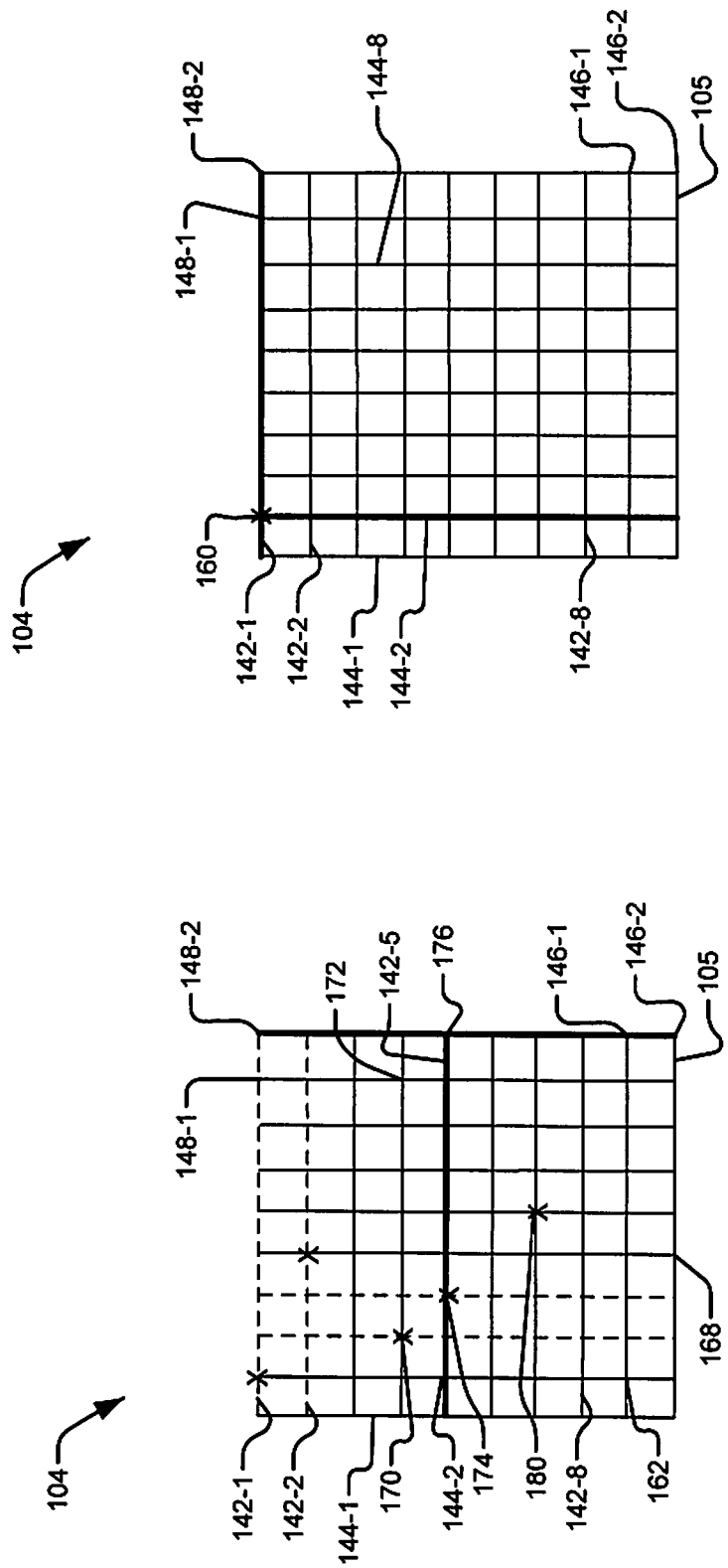

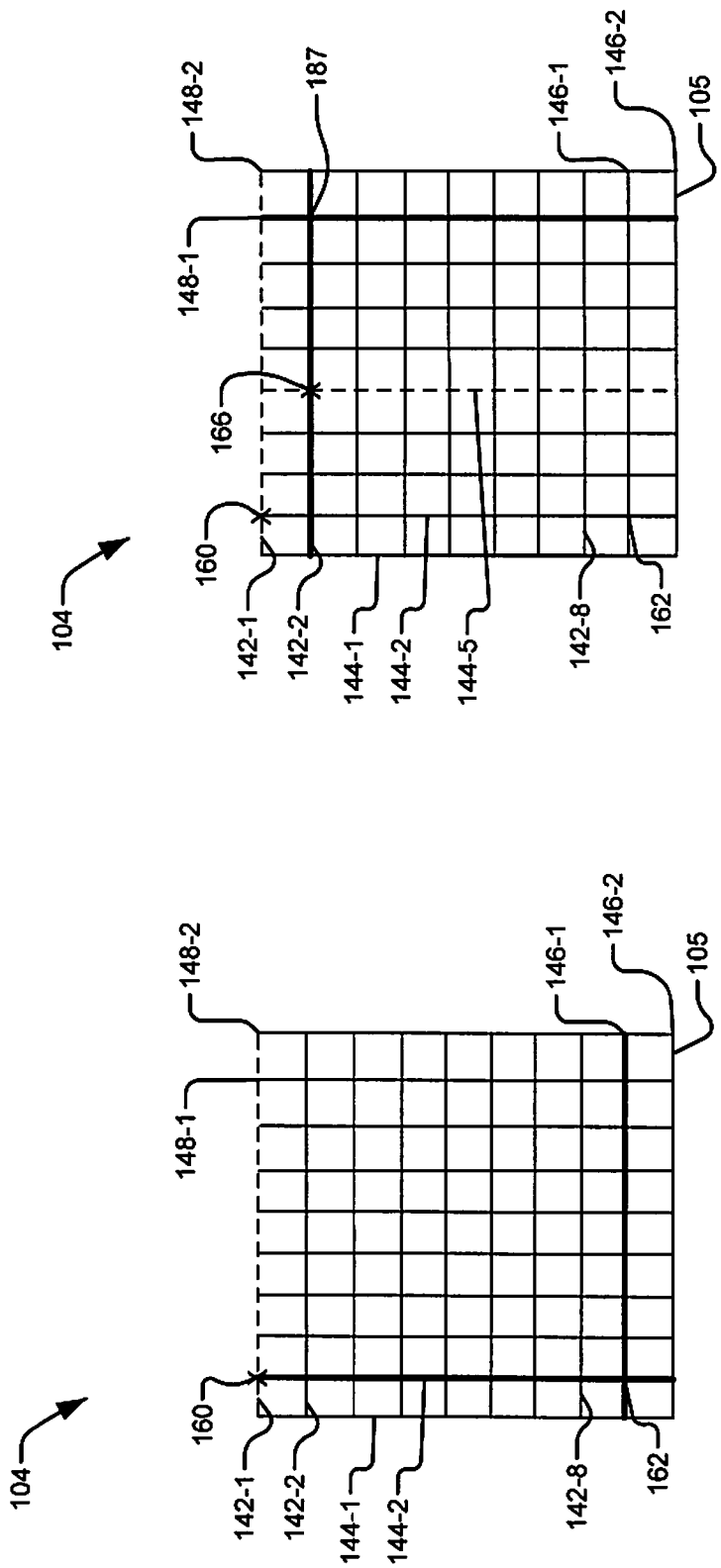

MEMORY REPAIR SYSTEM AND METHOD

CROSS-REFERENCE TO RELATED APPLICATIONS

This application is a continuation of U.S. patent application Ser. No. 11/869,308 filed on Oct. 9, 2007, which claims the benefit of U.S. Provisional Application No. 60/829,072, filed on Oct. 11, 2006. The disclosures of the above applications are incorporated herein by reference in their entirety.

FIELD

The present disclosure relates to memory devices, and more particularly to repairing memory locations within memory devices.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor memory devices, such as random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM), and/or flash memory, include an integrated circuit (IC) that stores data and/or code. In certain applications, loss of any of the data may require a manufacturer and/or end user to replace the memory, which may be costly.

Referring now to FIG. 1, a memory control module 10 may control read/write operations to memory 14. The memory 14 includes memory banks 42-1, 42-2, ..., and 42-$x$ (collectively referred to as memory banks 42). Each memory bank 42 includes address rows 44-1, 44-2, ..., and 44-$y$, referred to collectively as address rows 44, and address columns 46-1, 46-2, ..., and 46-$z$ (collectively referred to as address columns 46). Data bits are stored in the memory 14 according to specific address rows 44 and address columns 46 in each memory bank 42. Various methods are used to correct defects and improve memory yield. One method includes adding redundant address locations to the memory 14.

Referring now to FIGS. 2A and 2B, a memory repair device 64 may correct defects in the memory 14. The memory repair device 64 may be internal or external to a system that includes the memory 14. The memory repair 64 device may be implemented in a built-in self-test (BIST) that may include hardware or automatic test equipment (ATE) that may include software. The memory repair device 64 may command a memory repair sub-circuit 65 that may substitute redundant rows and/or columns of the memory 14 for defective address rows and/or columns.

The memory 14 includes memory banks 42, address rows 44, and address columns 46. Each memory bank 42 includes redundant address rows 58-1, 58-2, ..., and 58-$m$ (referred to collectively as redundant address rows 58), and/or redundant address columns 60-1, 60-2, ..., and 60-$n$ (referred to collectively as redundant address columns 60). Alternatively, the memory 14 may include redundant memory banks that may be substituted for defective banks.

Initially, the bit locations provided by the redundant address rows 58 and address columns 60 are not associated with a particular memory address. The memory repair sub-circuit 65 programs the redundant address rows 58 and address columns 60 to correspond to a specific memory address when a bit location associated with a memory address is found to be defective. The memory repair sub-circuit 65 may use hard repair or soft repair operations. Both hard and soft repair operations result in a redundant memory portion being used to store the data that would have otherwise been stored in the defective memory portion. Basically, the defective memory portion is remapped to the redundant memory portion either reversibly with a soft repair operation or irreversibly with a hard repair operation.

For a hard repair operation, the memory repair sub-circuit 65 may include fuses 63-1, 63-2, ..., and 63-$a$, referred to collectively as fuses 63 (e.g. laser fuses and/or electrical fuses). The memory repair device 64 is connected to the memory repair sub-circuit 65 to determine a defective bit location associated with a memory address. The memory repair device 64 blows one or more of the fuses 63 (i.e. applies a laser or electrical current to the fuses 63) to form a new data path to the redundant location. Thereafter, data that is directed to be stored at the memory address may be stored in the redundant location. In this manner, an originally defective memory device may be repaired and also may be suitable to be used and/or sold.

In FIG. 2B, an exemplary memory repair sub-circuit 65 is shown in further detail. Signals 66-1, 66-2, ..., and 66-$b$, referred to collectively as signals 66, are indicative of memory addresses of defective memory locations. For example, the signals 66 may be indicative of a defective address row. The memory repair sub-circuit 65 receives the signals 66 and a repair signal 67 from the memory repair device 64. The signals 66 are input to a redundant row decoder 68. The redundant row decoder 68 communicates with a redundant row 58-1 according to statuses of the fuses 63. As described above, the memory repair device 64 may be used to blow one or more of the fuses 63 to program the redundant row decoder 68 to associate a particular memory address with the redundant row 58-1. A similar approach may be used for redundant columns.

As mentioned, the above-described memory hard repair operation results in a permanent re-association of the memory address with the redundant location. The memory repair operation permanently changes the electrical behavior of the fuse element. In the case of a laser fuse, a high energy laser beam cuts through the fuse (i.e. a conductive fuse element is rendered non-conductive as a result of the memory repair operation). In the case of an electrical fuse, an electric pulse or pulses are applied to the fuse element. As a result, the fuse element changes from conductive to non-conductive or from non-conductive to conductive. A hard repair is performed once during manufacturing test, and is permanent for the lifetime of the memory.

For a soft repair, the memory repair device 64 remaps data paths by storing values in a remapping register of the memory repair sub-circuit 65 so that data is stored in memory 14 according to the remapping register. For example, the remapping register causes certain logic gates to be turned on and other logic gates to be turned off similar to blowing fuses in the hard repair operation. The registers, however, may be reset; and soft repairs may not permanently alter data paths to the memory 14.

SUMMARY

A memory system is provided and includes an array of memory cells and a repair module. The array of memory cells includes redundant memory cells. The redundant memory cells include at least two of (i) a redundant row of memory cells and (ii) a redundant column of memory cells. The repair module is configured to (i) identify at least two of a row and a column of the array of memory cells having non-operational memory cells and (ii) substitute the at least two of the row and the column of the array of memory cells having non-operational memory cells with selected rows or columns of the redundant memory cells based on X predetermined sequences of substitutions, where X is an integer greater than 1. The repair module is configured to detect a failure in the array of memory cells that cannot be repaired using the X predetermined sequences of substitutions, and use an alternative repair sequence to repair the non-operational memory cells based on the detection of the failure.

In other features, a self-repairing memory system includes memory including memory elements and redundant memory elements. The memory elements include a plurality of memory cells. A memory repair module identifies non-operational memory cells and selects at least one memory element including the non-operational memory cells. A first repair sub-circuit soft repairs the memory by substituting the selected memory elements with the redundant memory elements. A second repair sub-circuit hard repairs the memory based on the substitutions.

In other features, the second repair sub-circuit hard repairs the memory when substantially all of the non-operational memory cells identified by the memory repair module are repaired by the substitutions. The first memory repair sub-circuit includes registers, and the second memory repair sub-circuit includes at least one of fuses and anti-fuses. At least one of the first memory repair sub-circuit, the second memory repair sub-circuit, the memory repair module, and the memory control module is integrated with the memory in an integrated circuit. The memory repair module selects one of the memory elements for a respective one of the non-operational memory cells from a group consisting of at least two of a row, a column, a block, and a bank.

In other features, the memory repair module includes a built-in system test (BIST) module. The memory repair module tests the redundant elements for failures prior to the soft repairs. Prior to the hard repairs, at least one of the redundant elements is used to store data that implements at least one of the soft repairs. The at least one redundant element stores data that is used to implement the soft repairs during boot-up of the memory. The memory repair module selects one of the memory elements for each of the non-operational memory cells from a group consisting of a row, a column, a block, and a bank based on a first predetermined combination.

In other features, the first predetermined combination includes selecting two rows and two columns of the redundant memory elements to replace two rows and two columns of the memory elements. The memory repair module selects a second predetermined combination when the first predetermined combination fails to repair the non-operational memory cells. When the second predetermined combination is selected, the memory repair module does not retain repair data of prior substitutions relating to the first predetermined combination.

In other features, a memory system includes memory including memory elements and redundant memory elements. The memory elements include a plurality of memory cells. A memory repair module identifies non-operational memory cells and selects at least one memory element including the non-operational memory cells based on X different combinations of substitutions. The memory repair module substitutes one of the redundant elements for one of the selected memory elements for each of the substitutions. The memory repair module determines that one of the X different combinations of substitutions repairs the memory. X is a number greater than 1.

In other features, a first memory repair sub-circuit soft repairs the memory based on the substitutions. A second memory repair sub-circuit hard repairs the memory based on one of the X different combinations. The first memory repair sub-circuit includes a plurality of registers, and the second memory repair sub-circuit includes at least one of a plurality of fuses and a plurality of anti-fuses. The first and second memory repair sub-circuits are integrated with the memory in an integrated circuit.

In other features, the memory repair module selects one of the memory elements for a respective one of the non-operational memory cells from a group consisting of at least two of a row, a column, a block, and a bank. The memory repair module includes a built-in system test (BIST). The memory repair module tests one of the redundant elements for failures prior to the substitutions. The memory repair module substitutes the selected memory elements with one of the redundant memory elements for each of the substitutions until the memory repair module determines that the X different combinations fail to repair the memory.

In other features, the memory repair module tests the memory according to each of the X different combinations successively. For each successive one of the X different combinations, the memory repair module does not retain data of prior substitutions of the redundant memory elements. The memory repair module substitutes the one of the redundant elements for the one of the selected memory elements for each of the substitutions until the memory repair module determines that one of the X different combinations of substitutions repairs the memory.

In other features, a method for self-repairing a memory system includes identifying non-operational memory cells of memory elements. Memory includes the memory elements and redundant memory elements. The memory elements include a plurality of memory cells including the non-operational cells. The method also includes selecting at least one memory element including the non-operational memory cells. The method also includes soft-repairing the memory by substituting the selected memory elements with the redundant memory elements. The method also includes hard-repairing the memory based on the substitutions.

In other features, the method includes hard-repairing the memory when substantially all of the non-operational memory cells identified by the memory repair module are repaired by the substitutions. The method also includes hard-repairing the memory by operating at least one of fuses and anti-fuses. The method also includes selecting one of the memory elements for a respective one of the non-operational memory cells from a group consisting of at least two of a row, a column, a block, and a bank. The method also includes testing the redundant elements for failures prior to the soft-repairing. The method also includes storing data that implements at least one of the soft repairs in at least one of the redundant elements.

In other features, the method includes storing data that is used to implement the soft-repairing during boot-up of the memory. The method also includes selecting one of the memory elements for each of the non-operational memory cells from a group consisting of a row, a column, a block, and a bank based on a first predetermined combination. The first predetermined combination includes selecting two rows and two columns of the redundant memory elements to replace two rows and two columns of the memory elements. The method also includes selecting a second predetermined combination when the first predetermined combination fails to repair the non-operational memory cells.

In other features, a method includes identifying non-operational memory cells. The method also includes selecting at least one memory element including the non-operational memory cells based on X different combinations of substitutions. The method also includes substituting one of a plurality of redundant elements for one of the selected memory elements for each of the substitutions. The method also includes determining that one of the X different combinations of substitutions repairs the memory. X is a number greater than 1.

In other features, the method includes soft-repairing the memory based on the substitutions. The method also includes hard-repairing the memory based on the one of the X different combinations. The memory elements are selected from a group consisting of at least two of a row, a column, a block, and a bank. The method also includes testing one of the redundant elements for failures prior to the substitutions. The method also includes substituting the selected memory elements with one of the redundant memory elements for each of the substitutions until the X different combinations fail to repair the memory. The method also includes testing the memory according to each of the X different combinations successively.

In other features, the method includes substituting one of the redundant elements for the one of the selected memory elements for each of the substitutions. The substitutions continue until determining that one of the X different combinations of substitutions repairs the memory.

In other features, a self-repairing memory system includes storage means for storing data including memory elements and redundant memory elements. The memory elements include a plurality of memory cells. The system also includes memory repair means for identifying non-operational memory cells and for selecting at least one memory element including the non-operational memory cells. The system also includes first repair means for soft-repairing the memory by substituting the selected memory elements with the redundant memory elements. The system also includes second repair means for hard-repairing the memory based on the substitutions.

In other features, the second repair means hard repairs the memory when substantially all of the non-operational memory cells identified by the memory repair means are repaired by the substitutions. The first memory repair means includes registers and the second memory repair means includes at least one of fuses and anti-fuses. The memory repair means selects one of the memory elements for a respective one of the non-operational memory cells from a group consisting of at least two of a row, a column, a block, and a bank. The memory repair means includes a built-in system test (BIST).

In other features, the memory repair means tests the redundant elements for failures prior to the soft repairs. Prior to the hard repairs, at least one of the redundant elements is used to store data that implements at least one of the soft repairs. At least one redundant element stores data that is used to implement the soft repairs during boot-up of the storage means. The memory repair means selects one of the memory elements for each of the non-operational memory cells from a group consisting of a row, a column, a block, and a bank based on a first predetermined combination. The first predetermined combination includes selecting two rows and two columns of the redundant memory elements to replace two rows and two columns of the memory elements.

In other features, the memory repair means selects a second predetermined combination when the first predetermined combination fails to repair the non-operational memory cells. When the second predetermined combination is selected, the memory repair means does not retain repair data of prior substitutions relating to the first predetermined combination.

In other features, a memory system includes storage means for storing data including memory elements and redundant memory element. The memory elements include a plurality of cells. The system also includes memory repair means for identifying non-operational memory cells and for selecting at least one memory element including the non-operational memory cells based on X different combinations of substitutions. The memory repair means substitutes one of the redundant elements for one of the selected memory elements for each of the substitutions. The memory repair means determines that one of the X different combinations of substitutions repairs the memory. X is a number greater than 1.

In other features, a memory system includes first memory repair means for soft-repairing the storage means based on the substitutions. The system also includes second memory repair means for hard-repairing the storage means based on the one of the X different combinations. The first memory repair means includes a plurality of registers and the second memory repair means includes at least one of a plurality of fuses and a plurality of anti-fuses. The memory repair means selects one of the memory elements for a respective one of the non-operational memory cells from a group consisting of at least two of a row, a column, a block, and a bank.

In other features, the memory repair means includes a built-in system test (BIST). The memory repair means tests one of the redundant elements for failures prior to the substitutions. The memory repair means substitutes the selected memory elements with one of the redundant memory elements for each of the substitutions until the memory repair means determines that the X different combinations fail to repair the memory. The memory repair means tests the memory according to each of the X different combinations successively.

In other features, for each successive one of the X different combinations, the memory repair means does not retain data of prior substitutions of the redundant memory elements. The memory repair means substitutes one of the redundant elements for one of the selected memory elements for each of the substitutions. The substitutions are continued until the memory repair means determines that one of the X different combinations of substitutions repairs the storage means.

In other features, a self-repairing memory system includes memory including memory elements and redundant memory elements. The memory elements include a plurality of memory cells. A memory repair module identifies faulty memory cells and selects at least one memory element including the faulty memory cells. A repair sub-circuit includes reversibly programmable circuits that repair the memory by substituting the at least one memory element with the redundant memory elements.

In other features, the memory repair module selects one of the memory elements for each of the faulty memory cells from a group consisting of a row, a column, a block, and a bank based on a first predetermined combination. The first predetermined combination includes selecting two rows and two columns of the redundant memory elements to replace two rows and two columns of the memory elements.

In other features, the memory repair module selects a second predetermined combination when the first predetermined combination fails to repair the faulty memory cells. When the second predetermined combination is selected, the memory repair module does not retain repair data of prior substitutions relating to the first predetermined combination. The memory repair module cycles through a plurality of predetermined combinations to repair the faulty memory cells. The repair sub-circuit repairs the memory when substantially all of the faulty memory cells identified by the memory repair module are repaired by the substitutions.

In other features, the memory repair sub-circuit includes reversible fuses. The reversible fuses include flash based fuse circuits. The memory repair module selects one of the memory elements for a respective one of the faulty memory cells from a group consisting of at least two of a row, a column, a block, and a bank. The memory repair module comprises a built-in system test (BIST) module.

In other features, a self-repairing memory system includes means for storing data including memory elements and redundant memory elements. The memory elements include a plurality of memory cells. The system also includes memory repair means for identifying faulty memory cells and selecting at least one memory element including the faulty memory cells. Repair sub-means are included for reversibly programming circuits that repair the means for storing data by substituting at least one memory element with the redundant memory elements.

In other features, the memory repair means selects one of the memory elements for each of the faulty memory cells from a group consisting of a row, a column, a block, and a bank based on a first predetermined combination. The first predetermined combination includes selecting two rows and two columns of the redundant memory elements to replace two rows and two columns of the memory elements.

In other features, the memory repair means selects a second predetermined combination when the first predetermined combination fails to repair the faulty memory cells. When the second predetermined combination is selected, the memory repair means does not retain repair data of prior substitutions relating to the first predetermined combination. The memory repair means cycles through a plurality of predetermined combinations to repair the faulty memory cells. The repair sub-means repairs the means for storing data when substantially all of the faulty memory cells identified by the memory repair means are repaired by the substitutions.

In other features, the memory repair sub-means includes reversible fuses. The reversible fuses include flash based fuse circuits. The memory repair means selects one of the memory elements for a respective one of the faulty memory cells from a group consisting of at least two of a row, a column, a block, and a bank. The memory repair means comprises built-in system test (BIST) means for testing a system.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5 is a chart that illustrates a method for operating the memory repair system according to the present disclosure;

FIGS. 6A-6L are functional block diagrams of exemplary memory according to the present disclosure;

DETAILED DESCRIPTION

Figure 1:
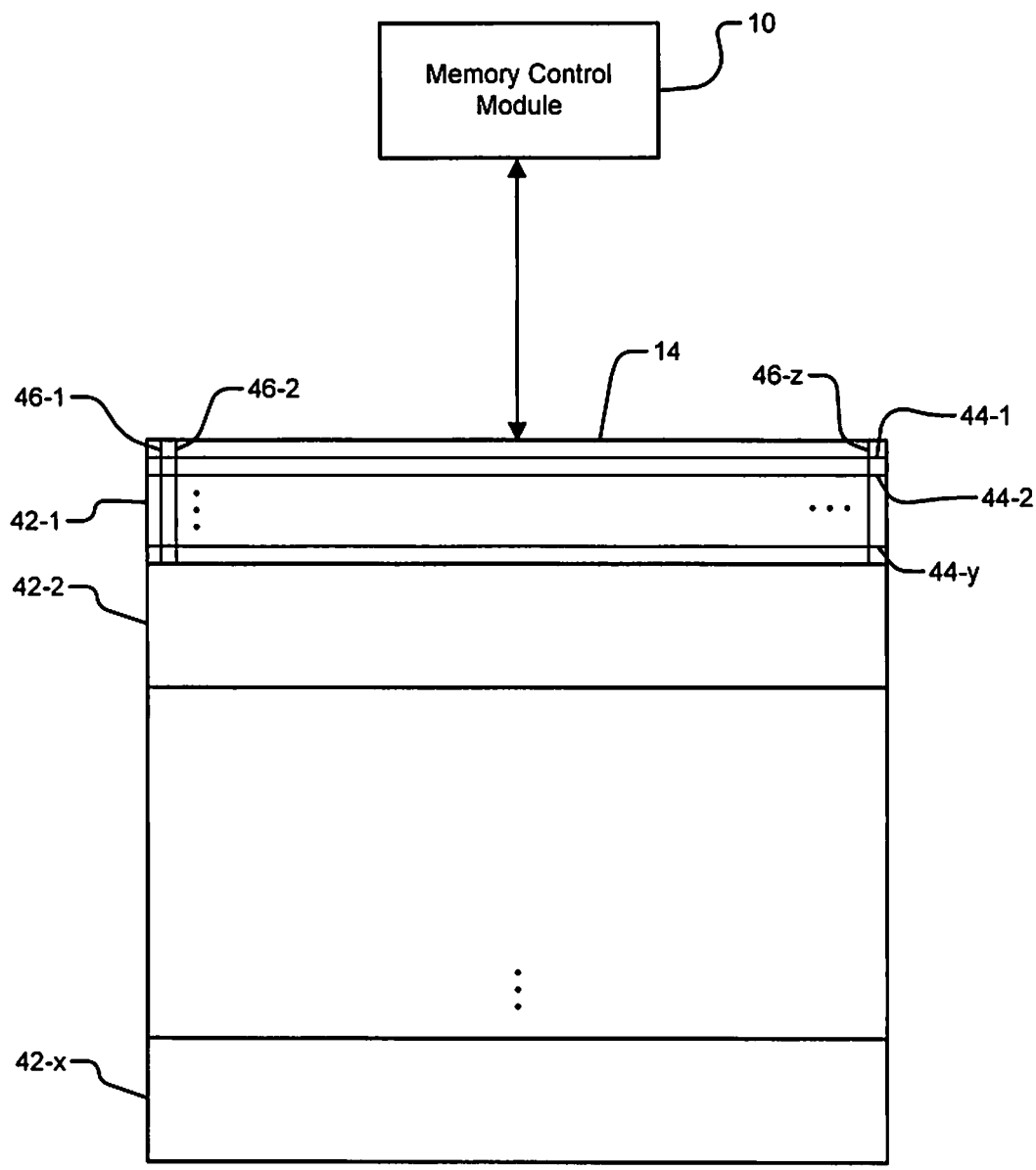
FIG. 1 is a functional block diagram of an exemplary memory system according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

According to the present disclosure, memory includes redundant and non-redundant data storage/memory elements. The data storage elements may be cells, rows, columns, banks, and/or blocks of the memory. A memory control module may detect defects in the memory and trigger a memory repair operation. A memory repair module may test the memory and determine what repairs, if any, will repair the memory.

The memory repair module may be a modified built-in system test (BIST) that repairs memory via an on-the-fly process that includes both soft and hard repair operations. When a failure occurs in a read/write from the memory, the memory repair module may respond as if the failed cell or cells are defective. The memory repair module may remap the memory based on one or more different repair combinations that may be sets of sequences of repair operations.

Each of the repair operation sequences may include the same number of predetermined repair operations that may relate to the number of redundant elements. Each of the repair operations may include substituting a defective element of the memory with a redundant element. The memory repair module may reallocate the redundant elements for each repair combination/set.

As mentioned, the number of repair combinations may relate to the number of redundant elements. For example, if there are two redundant rows and two redundant columns for a square memory array, the number of repair combinations may be determined according to: $C_2^4 \rightarrow (2+2)!/(2!\times 2!)=(1\times 2\times 3\times 4)/(1\times 2\times 1\times 2)=6$. Therefore, 6 different combinations of repair substitutions may be used to repair the memory. In other words, for this example, there are optimally 6 ways/combinations of substituting 4 redundant rows/columns for 4 non-redundant rows/columns in response to memory failures. To further illustrate, if there are four redundant rows and four redundant columns, $C_4^8 \rightarrow (4+4)!/(4!\times 4!)=70$. Therefore, there may be 70 different combinations that may be used to repair the memory.

The memory repair module may control soft repair operations to test each substitution while forming the new memory map. The soft repair operations may include simulating a hard repair operation by mapping a plurality of registers. The memory control module may read/write from memory according to the soft repairs so that the memory repair module may determine that one of the sequences has successfully repaired the memory. If the memory is repairable, the memory repair module may then control hard repair operations to permanently remap the memory according to the sequence that repairs the memory. In other words, the memory repair module may then blow fuses for a hard repair of the memory. In this manner, memory defects/failures may be repaired during manufacturing, after manufacturing, and/or after sale and use.

Figure 3:
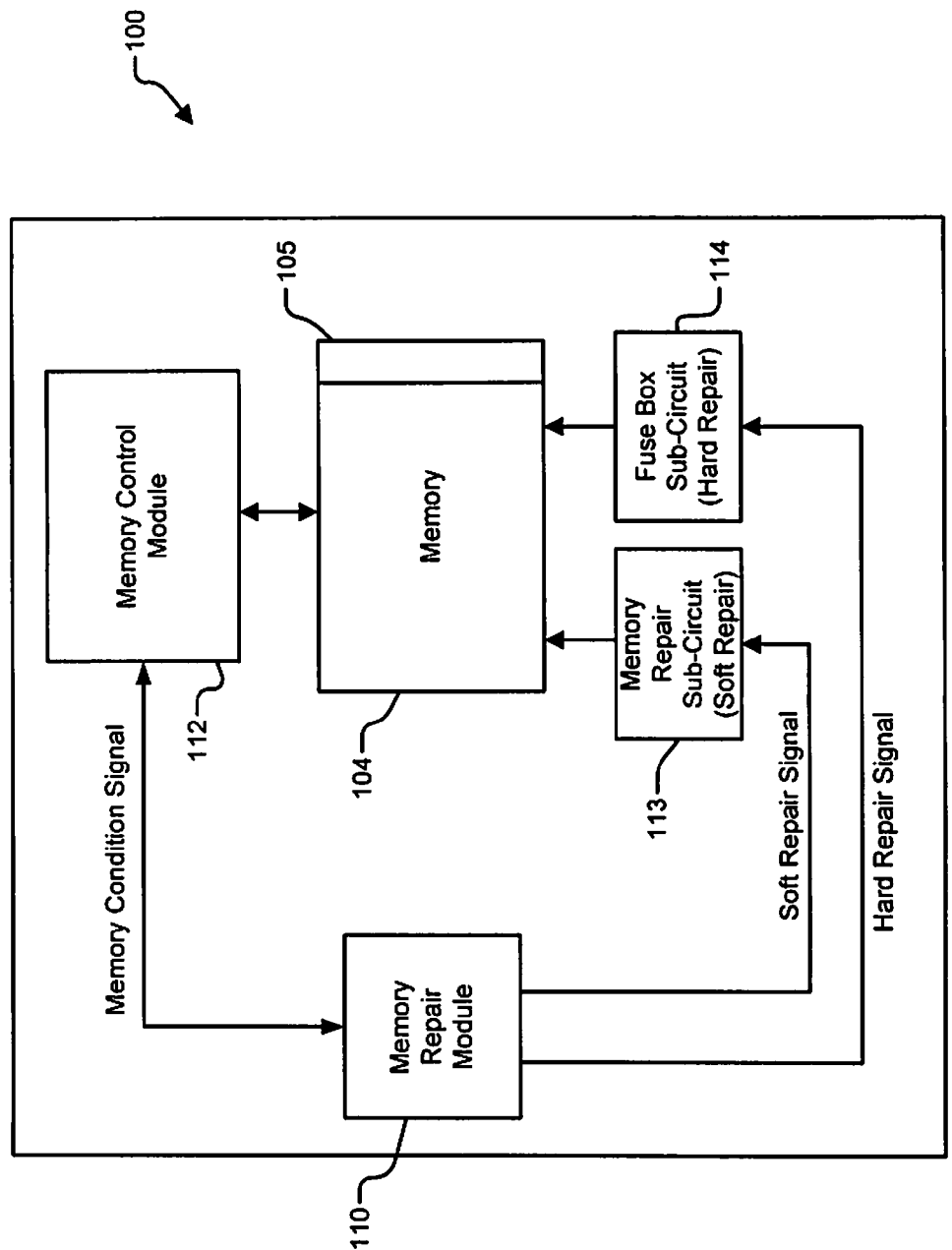
FIG. 3 is a functional block diagram of a memory repair system according to the present disclosure.

Referring now to FIG. 3, a system 100 for self-repair of memory 104 is shown. The memory 104 includes redundant memory elements 105 as described above. The system 100 further includes a memory repair module 110 and a memory control module 112.

The memory repair module 110 may control soft and hard repair operations when either or both the memory repair module 110 and the memory control module 112 detects a failure. The memory repair module 110 controls a first memory repair sub-circuit 113 for soft repair operations and a second memory repair sub-circuit, which may be a fuse box 114, for hard repair operations.

Alternatively, hard and soft repair operations may be included in a single hybrid module. Further, some or all of the hard and soft repair operations may be conducted through programmable reversible fuses, such as flash based fuse circuits, that may be written to/blown multiple times. For example, the memory repair module 110 may determine a repair necessary in a soft repair operation using the reversible fuses and then and then program the reversible fuses in a hard repair operation.

Figure 2A:
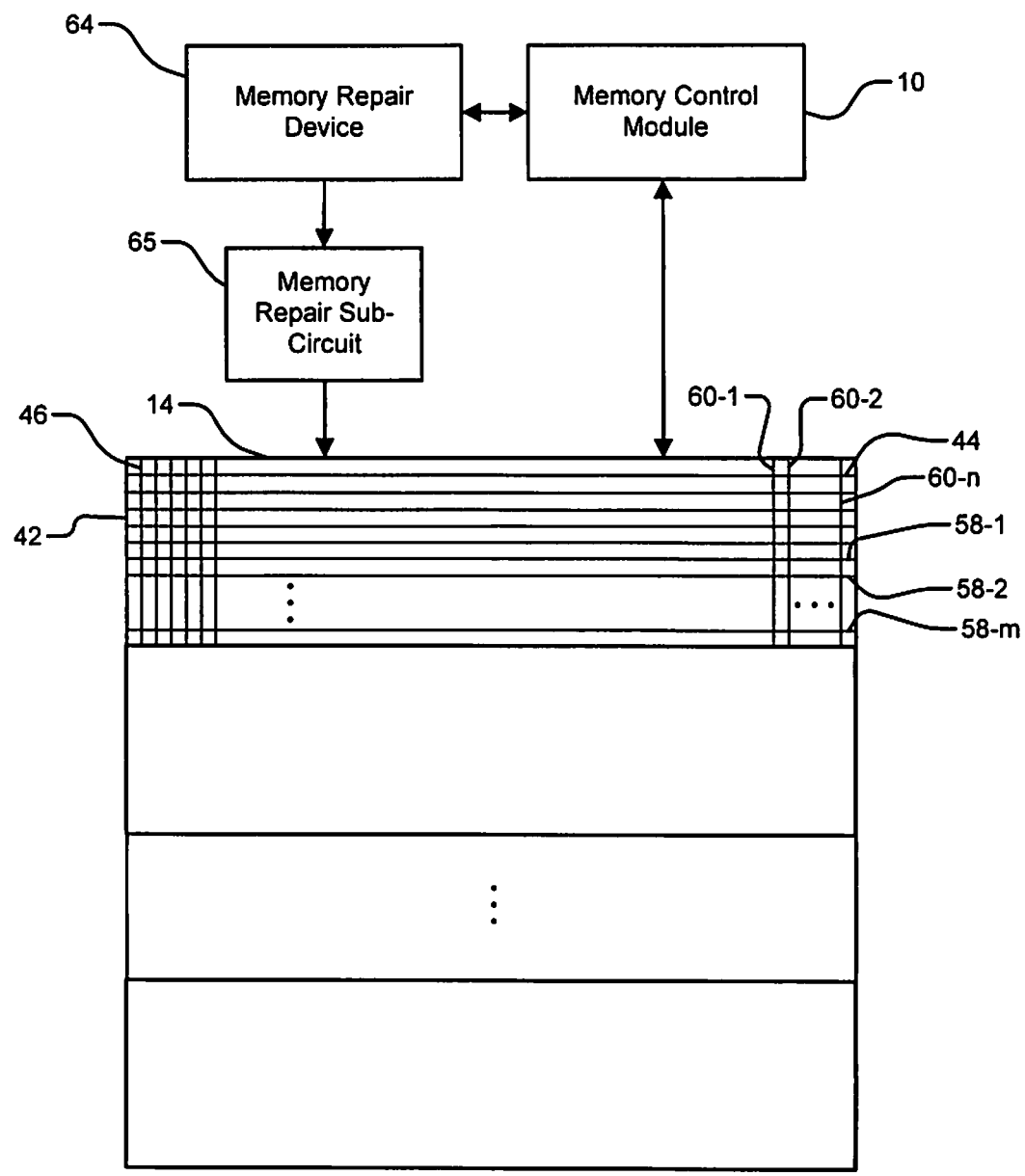
FIG. 2A is a functional block diagram of a memory that includes redundant rows and columns according to the prior art.
Figure 2B:
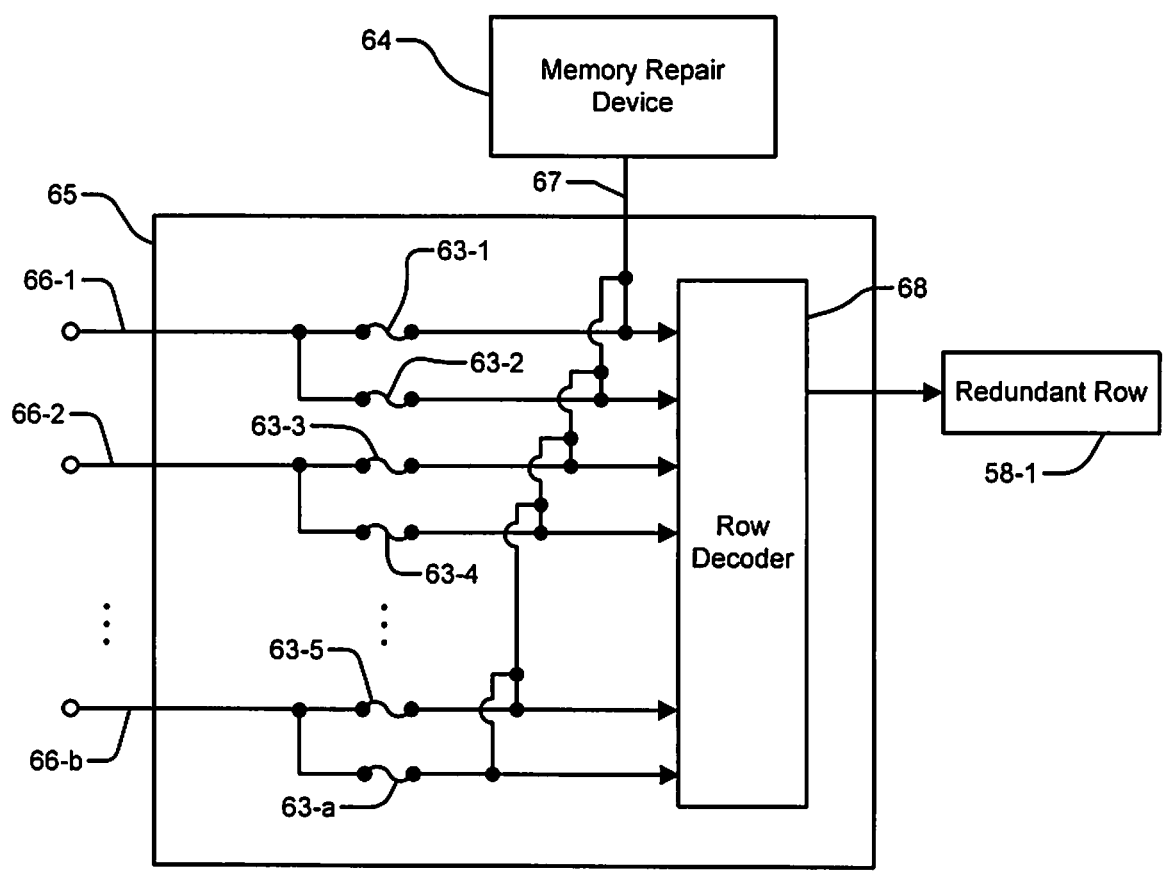
FIG. 2B is a functional block diagram of a redundant memory circuit that includes fuses according to the prior art.

The memory repair sub-circuit 113 may set one or more registers (not shown) to, for example, 0 and 1, to cause appropriate remapped data paths to be activated. The fuse box 114 may include fuse elements as described in FIGS. 2A and 2B. The memory 104 may be integrated with any or all of the memory repair module 110, the memory repair sub-circuit 113, and the fuse box 114.

The memory control module 112 may invoke the memory repair module 110 to repair memory failures. Alternatively, the memory repair module 110 may automatically detect and repair the memory failures at any time during and/or after manufacturing of the system 100. Therefore, external memory repair through, for example, automatic test equipment (ATE) may not be required. The memory repair module 110 may execute detect and/or repair functions conditionally, at power-up, and/or when triggered by a user.

Figure 4:
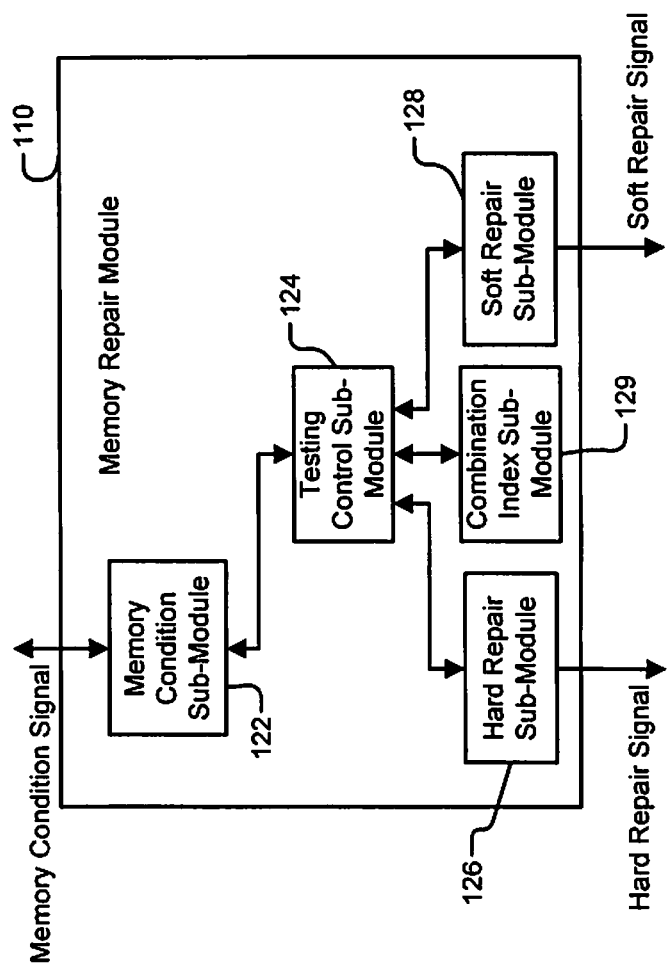
FIG. 4 is a functional block diagram of a memory repair module according to the present disclosure.

Referring now to FIG. 4, the memory repair module 110 may include memory condition, testing control, hard repair command, soft repair command, and combination index sub-modules 122, 124, 126, 128, 129. The testing control sub-module 124 may analyze data read from the memory 104 to determine whether the data read from respective addresses in the memory 104 matches the data originally written to those respective addresses. The testing control sub-module 124 may determine that a failure has been detected in the memory 104 when data read from a particular address in the memory 104 does not match the data written to that address. The testing control sub-module 124 may determine a soft repair map for the memory 104.

The soft repair sub-module 128 may control the memory repair sub-circuit 113 based on the soft repair map. When the testing control sub-module 124 determines that the memory 104 is repaired, the hard repair sub-module 126 may control the hard repair fuse box 114. The hard repair fuse box 114 may include non-programmable and/or programmable fuses, such as flash based fuse circuits.

The hard repair fuse box 114 may blow electrical fuses as necessary to re-associate memory addresses with the redundant memory elements 105 based on the soft repair map. Alternatively, the hard repair fuse box 114 may include anti-fuses that form connections as necessary to re-associate memory addresses with the redundant memory elements 105. Fuses would not need to be blown if the fuses used are programmable/reversible. The memory condition sub-module 122 generates repaired/not repairable signals that are received in the memory control module 112. The combination index sub-module 129 includes operations for a plurality of solution combinations for repairing the memory 104. Each of the combinations includes a sequence of repair operations and may be used by the testing control sub-module 124 for testing of the memory 104.

For soft repair operations, when the memory control module 112 detects a memory failure, the memory repair module 110 may store the memory failure information in the memory repair sub-circuit 113. Further, the memory repair module 110 may locate an alternative memory location (i.e. a redundant memory element). The memory repair module 110 may then store the redundant memory element information in the memory repair sub-circuit 113.

The information stored in the memory repair sub-circuit 113 may be lost when the system 100 is powered down. When the system 100 is subsequently powered on, the memory repair module 110 may again detect memory failures, locate redundant memory elements 105, and store the information in the memory repair sub-circuit 113. The memory repair module 110 may repeat this procedure at each power up. Alternatively, the memory repair sub-circuit 113 may retain the information by storing it in embedded memory (for example, flash memory) or by blowing reversible fuses.

Referring now to FIGS. 5, 6A, and 6B, as an illustrative example, memory 104 includes an array of A rows and B columns (A×B cells) and may have X redundant rows and Y redundant columns. The redundant rows and columns may be collectively referred to as redundant memory elements 105, as in FIG. 3. FIG. 6A includes eight rows 142-1, 142-2, . . . , and 142-8; eight columns 144-1, 144-2, . . . , and 144-8, two redundant rows 146-1, 146-2, and two redundant columns 148-1, 148-2. The two redundant rows 146-1, 146-2, and two redundant columns 148-1, 148-2 are merely exemplary. There may be only six placement/solution combinations for data within the four redundant elements 146-1, 146-2, 148-1, 148-2, as seen in the chart 150 of FIG. 5 and discussed above. The memory repair module 110 may use any or all of combinations 1-6 as illustrated for soft repairs on the memory 104. Each of the combinations may include a sequence for which substitutions will be made for the soft repairs. As mentioned, the combination index sub-module 129 includes information relating to the solution combinations. An alternative repair sequence may be used if the memory repair module 110 detects long term failure in the memory 104 that may not be repaired by one of the combinations in FIG. 5. The alternative repair sequence may include replacing rows and columns in orders other than those illustrated in FIG. 5.

In FIGS. 6A and 6B, a first failure 160 may occur at the intersection of row 142-1 and column 144-2. The memory repair module 110 may set the memory repair sub-circuit 113 according to the first combination. The memory repair module 110 may thus substitute redundant row 146-1 for row 142-1 undergoing testing in response to the failure 160. In other words, when the memory 104 is written/read, cell 162 (at the intersection of row 146-1 and column 144-2) is used in place of the cell having the failure 160. Because the entire row 142-1 containing the failure 160 is replaced, other failures that may be present in the row 142-1 may also be repaired by this substitution operation.

Referring now to FIGS. 6C and 6D, the memory repair module 110 continues to evaluate read data from the memory 104 until a second failure 166 is encountered at, for example, the intersection of row 142-2 and column 144-5). The memory repair module 110 may substitute redundant row 146-2 for row 142-2 in response to the second failure 166. Therefore, when the memory 104 is written/read, cell 168 (at the intersection of row 146-2 and column 144-5) is used in place of the cell having the failure 166.

Referring now to FIGS. 6E and 6F, the memory repair module 110 continues to evaluate read data from the memory 104 until a third failure 170 is encountered at, for example, the intersection of row 142-4 and column 144-3). The memory repair module 110 may substitute a redundant column 148-1 for the column 144-3 in response to the third failure 170. Therefore, when the memory 104 is written/read, cell 172 (at the intersection of row 142-4 and column 148-1) is used in place of the cell having the failure 170.

Referring now to FIGS. 6G and 6H, the memory repair module 110 continues to evaluate read data from the memory 104 until a fourth failure 174 is encountered at, for example, the intersection of row 142-5 and column 144-4). The memory repair module 110 may substitute a redundant column 148-2 for the column 144-4 in response to the fourth failure 174. Therefore, when the memory 104 is written/read, cell 176 (at the intersection of row 142-5 and column 148-2) is used in place of the cell having the failure 174.

Referring now to FIG. 6I, the memory repair module 110 may determine that the first combination of the chart 150 will not resolve failures in the memory 104 based on discovery of a fifth failure 180. The memory repair module 110 may then initialize the memory repair database and use the second combination that includes, according to the chart 150 of FIG. 5, sequentially replacing a row, a column, a row, and a column.

Referring now to FIGS. 6J-6K, the memory repair module 110 may test the memory from the start of the array and replace failures according to the second combination. The memory repair module 110 may thus substitute redundant row 146-1 for row 142-1 undergoing testing in response to the first failure 160. In other words, when the memory 104 is written/read, cell 162 (at the intersection of row 146-1 and column 144-2) is used in place of the cell having the failure 160.

Referring now to FIG. 6L, a second failure 166 may be detected at the intersection of row 142-2 and column 144-5. The memory repair module 110 may replace the column 144-5 with a redundant column 148-1 so that the cell 187 at the intersection of row 142-2 and column 144-5 substitutes for the cell including the failure 166. Further, for the third and fourth failures, the memory repair module 110 may replace a row and a column respectively. If third and/or fourth failures are not found, the memory repair module 110 may determine that the second combination is the correct combination for repairing the memory.

The memory repair module 110 may determine that the second combination of the chart 150 will not resolve failures in the memory 104 based on discovery of a fifth failure. The memory repair module 110 may then initialize the memory repair sub-circuit 113 and use the third combination. The memory repair module 110 may replace a row, a column, a column, and a row respectively, according to the chart 150 of FIG. 5.

The memory repair module 110 may likewise initialize the memory repair sub-circuit 113 and use combinations four through six in response to successive failures found when redundant elements are utilized. The memory repair module 110 may determine that the memory 104 is not repairable if none of the combinations resolve all memory failures. In the present example, there may be six options for redundancy placement, thus, a maximum of only six runs may be made to test and repair the memory 104. In contrast, previous memory repair methods used heuristic repair algorithms that were limited to single repair path and would not have reset a memory repair sub-circuit 113 for subsequent combinations/solutions.

The memory repair module 110 may generate a partial log for failures occurring during soft fixing operations and while testing. If repair operations will not use all repair resources, the unused redundant rows/columns of the memory 104 may store information regarding the valid redundant row/column, to be used during the functional life of the memory 104 during boot-up/power-up sequences. The memory repair module 110 may repair the memory 104 during a power-up sequence with soft repair operations and interrupt the system or any start-up operations if the memory 104 is not fixed or not fixable.

Alternatively, the memory repair module 110 may only include one combination. For example, memory 104 may include two memory blanks/blocks and one redundant memory bank/block (instead of the previously discussed row/column solutions). The memory repair module 110 may use the combination to soft repair a first failure in the memory banks by replacing the respective memory bank including the failure. If subsequent failures are found, the memory 104 may be determined to be unrepairable. Otherwise, the memory 104 is hard repaired according to the combination. This example may also be extended for memory 104 that includes only redundant rows or only redundant columns where there may be only one repair combination.

Figure 7:
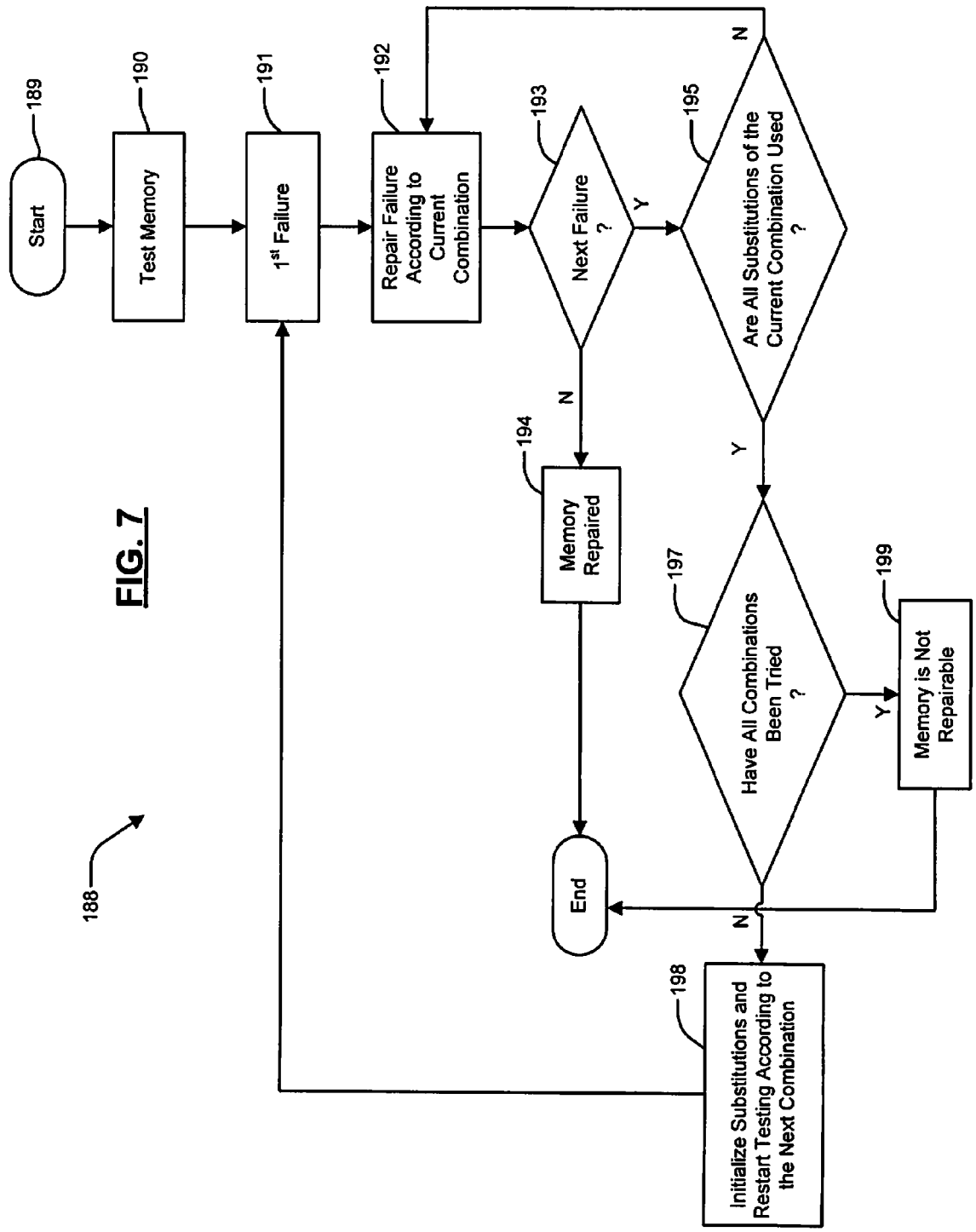
FIG. 7 is a flow diagram that illustrates steps for operating a memory repair module according to the present disclosure.

Referring now to FIG. 7, a flow diagram 188 illustrates steps for operating a memory repair module. Control starts in step 189, and in step 190, the memory repair module 110 tests the memory 104 for failures. In step 191, the memory repair module 110 detects a first failure. The memory repair module 110 then sequentially repairs the memory 104 according to repair combinations.

In step 192, the current repair combination, which may be a first, second, third, etc. repair combination (for example, combinations as in FIG. 5), is used to repair the failure. In other words, the combination includes a number of sequences for which redundant memory elements substitute for non-redundant memory elements. There may be one or more combinations of substitutions.

In step 193, if the memory repair module 110 does not detect another failure, the memory repair module 110 may assume the memory 104 is repaired in step 194. If another failure is detected in step 193, then in step 195, the memory repair module 110 determines whether all substitutions of redundant elements for the current combination have been made according to a repair substitution method (for example, one or more rows of the chart of FIG. 5). If step 195 is false, the next failure is repaired according to the current combination in step 192, and control returns to step 193 where the next failure of the current combination is used. All options of a repair substitution method are tried in steps 192, 193, and 195 until the memory is repaired or failed. If failed, then a repair substitution method for a next combination is tried in step 198.

If step 195 is true, and if all combinations have been tried in step 197, and there still is a failure, then the memory repair module 110 determines that the memory 104 is not repairable in step 199. If step 197 is false, substitutions made for previous combinations may be initialized. Further, testing may return to the start of the memory 104, and the substitution recipe of the next sequential combination may be used to repair the memory 104 in step 198.

Figure 8A:
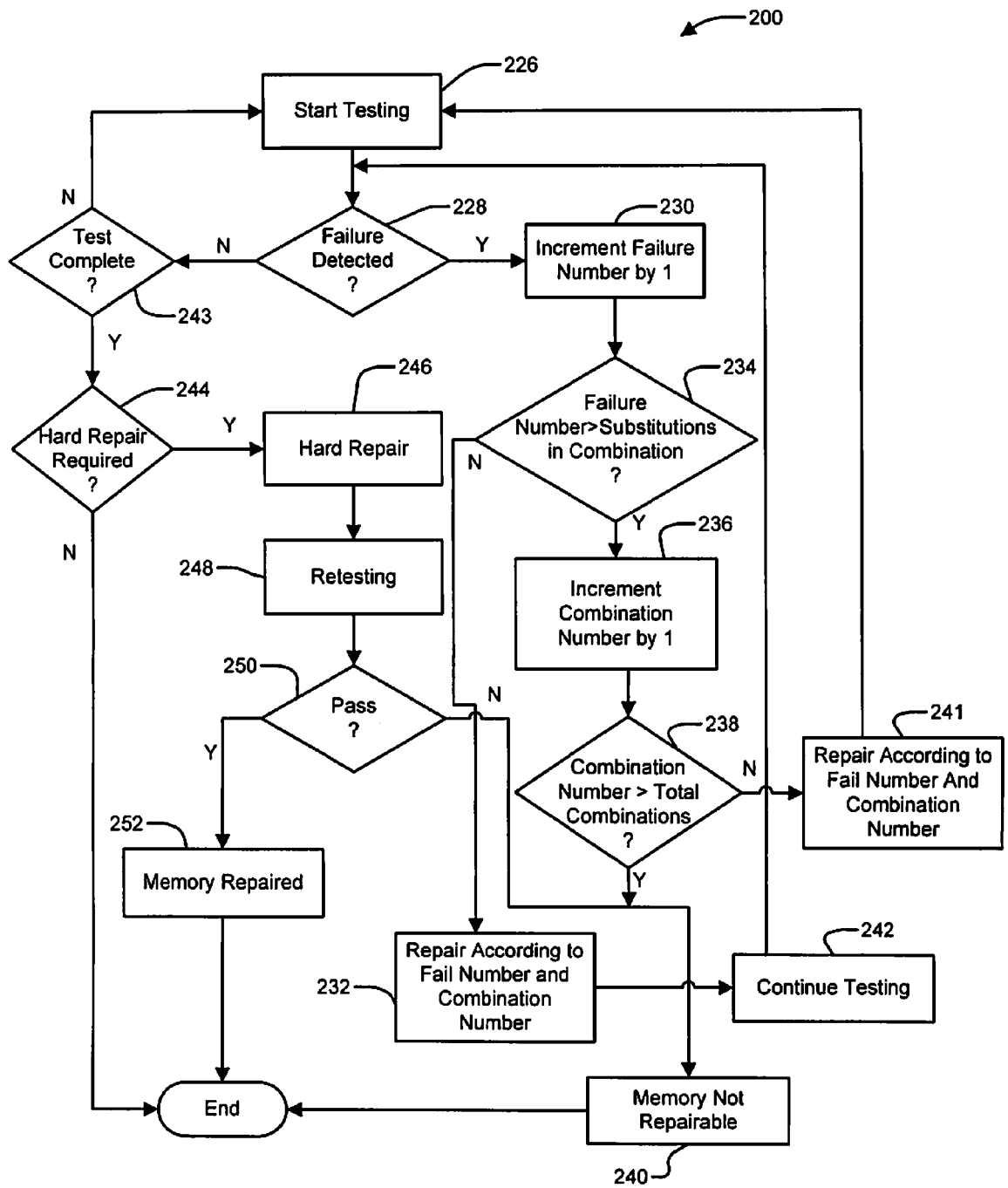
FIG. 8A is a flow diagram that illustrates steps of a memory repair method according to an embodiment of the present disclosure.

Referring now to FIG. 8A, steps performed by the memory control module 112 to implement a memory repair method 200 are shown. The memory repair method starts in step 226 where the memory control module 112 reads/writes from the memory 104. The memory repair module 110 may monitor the memory 104 for failures. If a first failure is found, a testing method starts according to the first combination found in chart 150. If a failure is detected in step 228, the failure number from the chart 150 is incremented in step 230; and the memory 104 is repaired according to the failure number and the combination number in step 232. However, if the failure number is greater than the number of possible substitutions (failure numbers) in the current combination in step 234, the combination number is incremented by one in step 236. If in step 238 the combination number is greater than the total number of combinations, the array is found not repairable in step 240. Otherwise, in step 241, the memory array is repaired according to the current fail number and combination number, and the memory control module 112 starts testing again according to step 226.

Following step 232, testing continues in step 242. If no failure is detected in step 228, and step 243 determines that testing operations are not completed, testing continues in step 226. If step 243 determines testing is completed, step 244 determines whether a hard repair is required. If step 244 is true, the memory 104 is hard repaired in step 246. The memory 104 is tested in step 248. If the memory 104 passes testing in step 250, the memory 104 is determined to be repaired in step 252. If step 250 is false, step 240 determines that the memory 104 is not repairable. For example, a system fault flag may be generated to notify the system and/or user that the system has a non-recoverable memory failure condition.

Figure 8B:
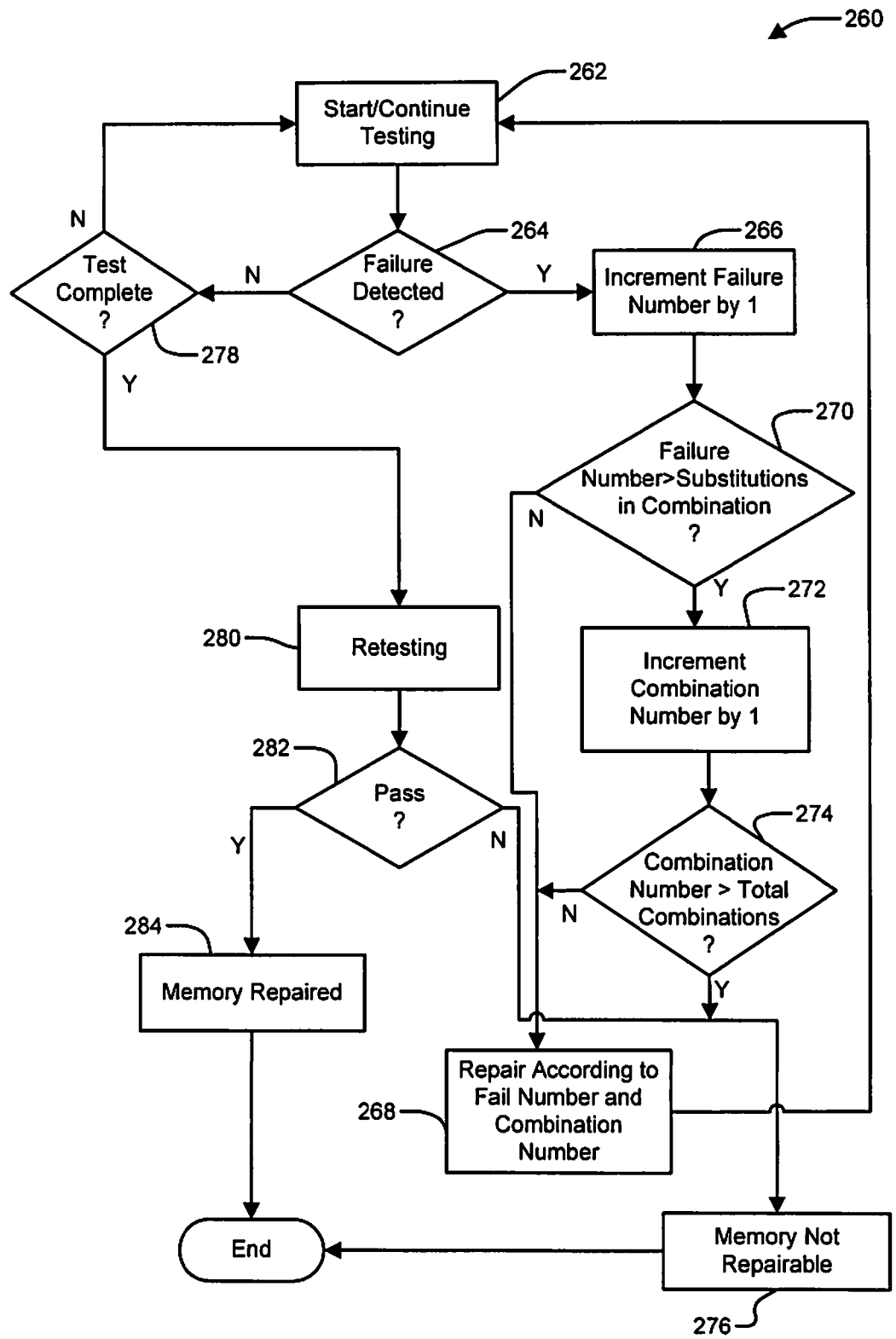
FIG. 8B is a flow diagram that illustrates steps of a memory repair method according to another embodiment of the present disclosure

Referring now to FIG. 8B, steps performed by the memory control module 112 to implement a memory repair method 260 using a hybrid repair module are shown. The memory repair method starts in step 262 where the memory control module 112 reads/writes from the memory 104. The memory repair module 110 may monitor the memory 104 for failures. If a first failure is found, a testing method starts according to the first combination found in chart 150. If a failure is detected in step 264, the failure number from the chart 150 is incremented in step 266; and the memory 104 is repaired according to the failure number and the combination number in step 268. The memory repairs may be conducted through use of reversible fuses. However, if the failure number is greater than the number of possible substitutions (failure numbers) in the current combination in step 270, the combination number is incremented by one in step 272. If in step 274 the combination number is greater than the total number of combinations, the array is found not repairable in step 276. Otherwise, in step 268, the memory array is repaired according to the current fail number and combination number.

Following step 268, testing continues in step 262. If no failure is detected in step 264, and step 278 determines that testing operations are not completed, testing continues in step 262. If step 278 determines testing is completed, the memory 104 may be retested in step 280. If the memory 104 passes testing in step 282, the memory 104 is determined to be repaired in step 284. If step 282 is false, step 276 determines that the memory 104 is not repairable.

The present disclosure can be applied to any memory technology that implements addressed memory locations. For example, the present invention can be applied to memory technologies including, but not limited to, random access memory (RAM), dynamic random access memory (DRAM), static random access memory (SRAM), magnetic RAM (MRAM), read only memory (ROM), programmable read only memory (PROM), electrically programmable read only memory (EPROM), electrically erasable programmable read only memory (EEPROM), and/or flash memory, as well as any derivative of the above memory technologies, such as fast cycle RAM (FCRAM).

Figure 9A:
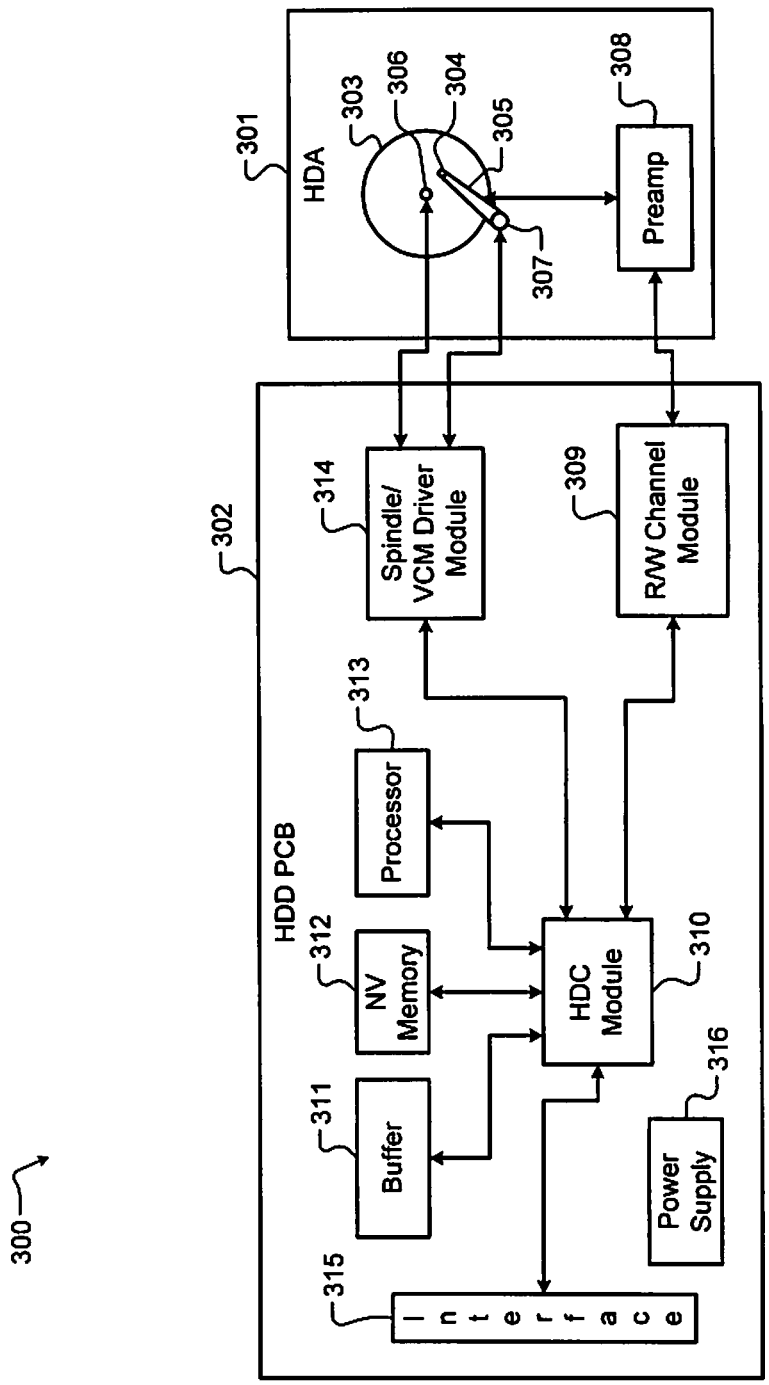
FIG. 9A is a functional block diagram of a hard disk drive.

Referring now to FIGS. 9A-9G, various exemplary implementations incorporating the teachings of the present disclosure are shown. Referring now to FIG. 9A, the teachings of the disclosure can be implemented in nonvolatile memory of a hard disk drive (HDD) 300. The HDD 300 includes a hard disk assembly (HDA) 301 and an HDD printed circuit board (PCB) 302. The HDA 301 may include a magnetic medium 303, such as one or more platters that store data, and a read/write device 304. The read/write device 304 may be arranged on an actuator arm 305 and may read and write data on the magnetic medium 303. Additionally, the HDA 301 includes a spindle motor 306 that rotates the magnetic medium 303 and a voice-coil motor (VCM) 307 that actuates the actuator arm 305. A preamplifier device 308 amplifies signals generated by the read/write device 304 during read operations and provides signals to the read/write device 304 during write operations.

The HDD PCB 302 includes a read/write channel module (hereinafter, "read channel") 309, a hard disk controller (HDC) module 310, a buffer 311, the nonvolatile memory 312, a processor 313, and a spindle/VCM driver module 314. The read channel 309 processes data received from and transmitted to the preamplifier device 308. The HDC module 310 controls components of the HDA 301 and communicates with an external device (not shown) via an I/O interface 315. The external device may include a computer, a multimedia device, a mobile computing device, etc. The I/O interface 315 may include wireline and/or wireless communication links.

The HDC module 310 may receive data from the HDA 301, the read channel 309, the buffer 311, nonvolatile memory 312, the processor 313, the spindle/VCM driver module 314, and/or the I/O interface 315. The processor 313 may process the data, including encoding, decoding, filtering, and/or formatting. The processed data may be output to the HDA 301, the read channel 309, the buffer 311, nonvolatile memory 312, the processor 313, the spindle/VCM driver module 314, and/or the I/O interface 315.

The HDC module 310 may use the buffer 311 and/or nonvolatile memory 312 to store data related to the control and operation of the HDD 300. The buffer 311 may include DRAM, SDRAM, etc. The nonvolatile memory 312 may include flash memory (including NAND and NOR flash memory), phase change memory, magnetic RAM, or multi-state memory, in which each memory cell has more than two states. The spindle/VCM driver module 314 controls the spindle motor 306 and the VCM 307. The HDD PCB 302 includes a power supply 316 that provides power to the components of the HDD 300.

Figure 9B:
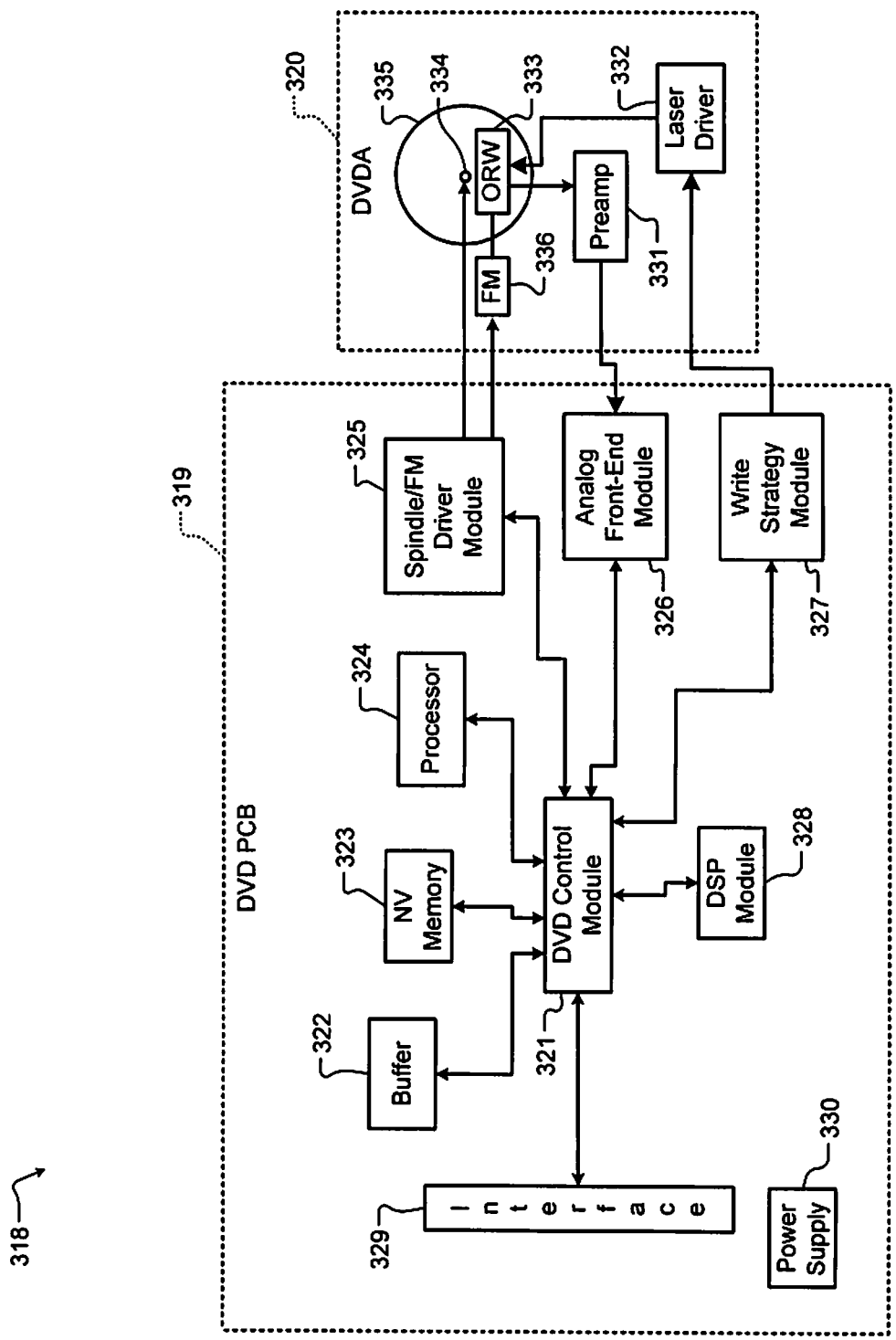
FIG. 9B is a functional block diagram of a DVD drive.

Referring now to FIG. 9B, the teachings of the disclosure can be implemented in nonvolatile memory of a DVD drive 318 or of a CD drive (not shown). The DVD drive 318 includes a DVD PCB 319 and a DVD assembly (DVDA) 320. The DVD PCB 319 includes a DVD control module 321, a buffer 322, the nonvolatile memory 323, a processor 324, a spindle/FM (feed motor) driver module 325, an analog front-end module 326, a write strategy module 327, and a DSP module 328.

The DVD control module 321 controls components of the DVDA 320 and communicates with an external device (not shown) via an I/O interface 329. The external device may include a computer, a multimedia device, a mobile computing device, etc. The I/O interface 329 may include wireline and/or wireless communication links.

The DVD control module 321 may receive data from the buffer 322, nonvolatile memory 323, the processor 324, the spindle/FM driver module 325, the analog front-end module 326, the write strategy module 327, the DSP module 328, and/or the I/O interface 329. The processor 324 may process the data, including encoding, decoding, filtering, and/or formatting. The DSP module 328 performs signal processing, such as video and/or audio coding/decoding. The processed data may be output to the buffer 322, nonvolatile memory 323, the processor 324, the spindle/FM driver module 325, the analog front-end module 326, the write strategy module 327, the DSP module 328, and/or the I/O interface 329.

The DVD control module 321 may use the buffer 322 and/or nonvolatile memory 323 to store data related to the control and operation of the DVD drive 318. The buffer 322 may include DRAM, SDRAM, etc. The nonvolatile memory 323 may include flash memory (including NAND and NOR flash memory), phase change memory, magnetic RAM, or multi-state memory, in which each memory cell has more than two states. The DVD PCB 319 includes a power supply 330 that provides power to the components of the DVD drive 318.

The DVDA 320 may include a preamplifier device 331, a laser driver 332, and an optical device 333, which may be an optical read/write (ORW) device or an optical read-only (OR) device. A spindle motor 334 rotates an optical storage medium 335, and a feed motor 336 actuates the optical device 333 relative to the optical storage medium 335.

When reading data from the optical storage medium 335, the laser driver provides a read power to the optical device 333. The optical device 333 detects data from the optical storage medium 335, and transmits the data to the preamplifier device 331. The analog front-end module 326 receives data from the preamplifier device 331 and performs such functions as filtering and A/D conversion. To write to the optical storage medium 335, the write strategy module 327 transmits power level and timing data to the laser driver 332. The laser driver 332 controls the optical device 333 to write data to the optical storage medium 335.

Figure 9D:
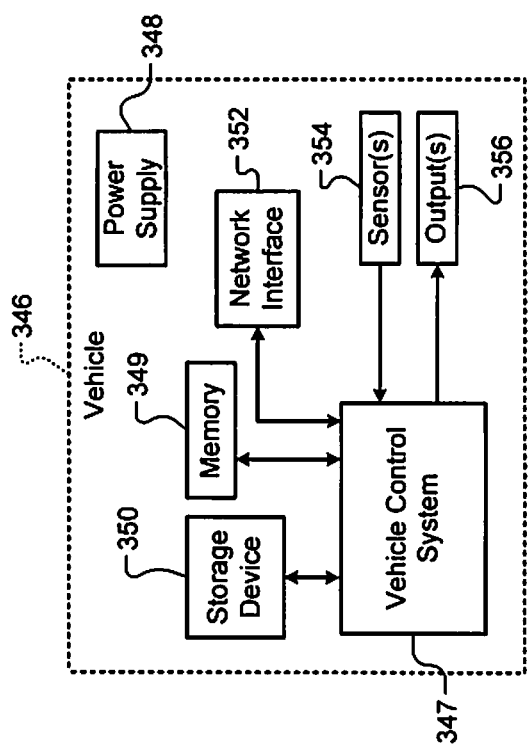
FIG. 9D is a functional block diagram of a vehicle control system.
Figure 9C:
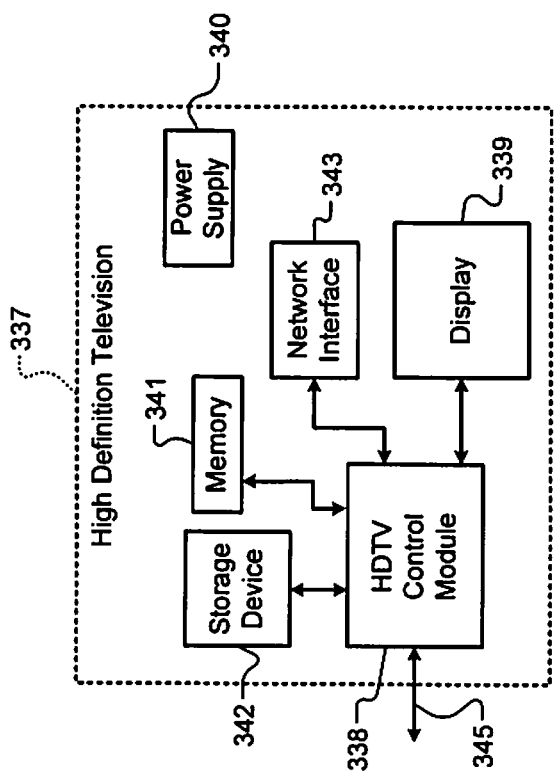
FIG. 9C is a functional block diagram of a high definition television.

Referring now to FIG. 9C, the teachings of the disclosure can be implemented in memory of a high definition television (HDTV) 337. The HDTV 337 includes an HDTV control module 338, a display 339, a power supply 340, the memory 341, a storage device 342, a network interface 343, and an external interface 345. If the network interface 343 includes a wireless local area network interface, an antenna (not shown) may be included.

The HDTV 337 can receive input signals from the network interface 343 and/or the external interface 345, which can send and receive data via cable, broadband Internet, and/or satellite. The HDTV control module 338 may process the input signals, including encoding, decoding, filtering, and/or formatting, and generate output signals. The output signals may be communicated to one or more of the display 339, memory 341, the storage device 342, the network interface 343, and the external interface 345.

Memory 341 may include random access memory (RAM) and/or nonvolatile memory such as flash memory, phase change memory, or multi-state memory, in which each memory cell has more than two states. The storage device 342 may include an optical storage drive, such as a DVD drive, and/or a hard disk drive (HDD). The HDTV control module 338 communicates externally via the network interface 343 and/or the external interface 345. The power supply 340 provides power to the components of the HDTV 337.

Referring now to FIG. 9D, the teachings of the disclosure may be implemented in memory of a vehicle 346. The vehicle 346 may include a vehicle control system 347, a power supply 348, the memory 349, a storage device 350, and a network interface 352. If the network interface 352 includes a wireless local area network interface, an antenna (not shown) may be included. The vehicle control system 347 may be a powertrain control system, a body control system, an entertainment control system, an anti-lock braking system (ABS), a navigation system, a telematics system, a lane departure system, an adaptive cruise control system, etc.

The vehicle control system 347 may communicate with one or more sensors 354 and generate one or more output signals 356. The sensors 354 may include temperature sensors, acceleration sensors, pressure sensors, rotational sensors, airflow sensors, etc. The output signals 356 may control engine operating parameters, transmission operating parameters, suspension parameters, etc.

The power supply 348 provides power to the components of the vehicle 346. The vehicle control system 347 may store data in memory 349 and/or the storage device 350. Memory 349 may include random access memory (RAM) and/or nonvolatile memory such as flash memory, phase change memory, or multi-state memory, in which each memory cell has more than two states. The storage device 350 may include an optical storage drive, such as a DVD drive, and/or a hard disk drive (HDD). The vehicle control system 347 may communicate externally using the network interface 352.

Figure 9F:
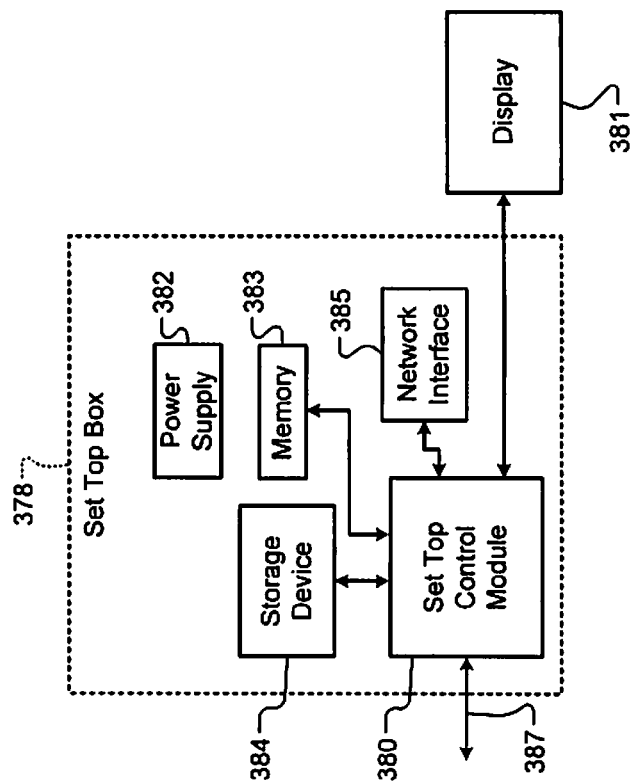
FIG. 9F is a functional block diagram of a set top box.
Figure 9E:
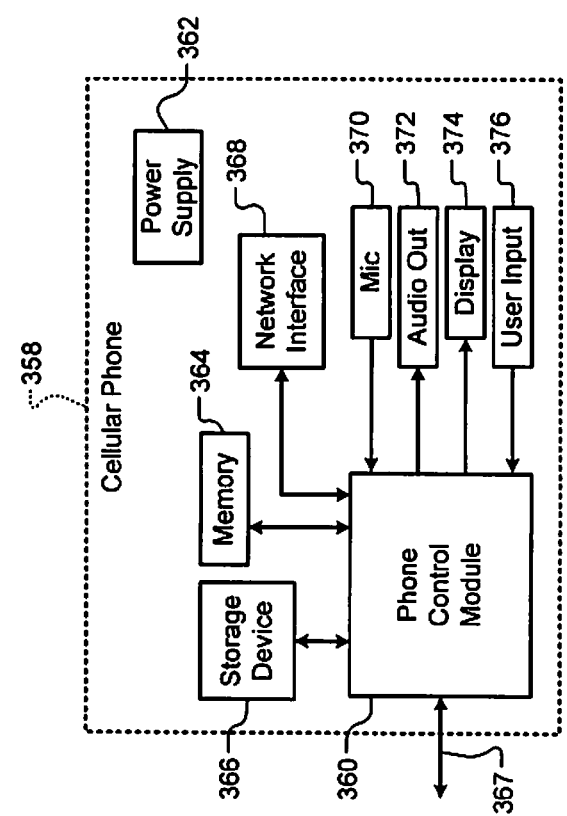
FIG. 9E is a functional block diagram of a cellular phone.

Referring now to FIG. 9E, the teachings of the disclosure can be implemented in memory of a cellular phone 358. The cellular phone 358 includes a phone control module 360, a power supply 362, the memory 364, a storage device 366, and a cellular network interface 367. The cellular phone 358 may include a network interface 368, a microphone 370, an audio output 372 such as a speaker and/or output jack, a display 374, and a user input device 376 such as a keypad and/or pointing device. If the network interface 368 includes a wireless local area network interface, an antenna (not shown) may be included.

The phone control module 360 may receive input signals from the cellular network interface 367, the network interface 368, the microphone 370, and/or the user input device 376. The phone control module 360 may process signals, including encoding, decoding, filtering, and/or formatting, and generate output signals. The output signals may be communicated to one or more of memory 364, the storage device 366, the cellular network interface 367, the network interface 368, and the audio output 372.

Memory 364 may include random access memory (RAM) and/or nonvolatile memory such as flash memory, phase change memory, or multi-state memory, in which each memory cell has more than two states. The storage device 366 may include an optical storage drive, such as a DVD drive, and/or a hard disk drive (HDD). The power supply 362 provides power to the components of the cellular phone 358.

Referring now to FIG. 9F, the teachings of the disclosure can be implemented in memory of a set top box 378. The set top box 378 includes a set top control module 380, a display 381, a power supply 382, the memory 383, a storage device 384, and a network interface 385. If the network interface 385 includes a wireless local area network interface, an antenna (not shown) may be included.

The set top control module 380 may receive input signals from the network interface 385 and an external interface 387, which can send and receive data via cable, broadband Internet, and/or satellite. The set top control module 380 may process signals, including encoding, decoding, filtering, and/or formatting, and generate output signals. The output signals may include audio and/or video signals in standard and/or high definition formats. The output signals may be communicated to the network interface 385 and/or to the display 381. The display 381 may include a television, a projector, and/or a monitor.

The power supply 382 provides power to the components of the set top box 378. Memory 383 may include random access memory (RAM) and/or nonvolatile memory such as flash memory, phase change memory, or multi-state memory, in which each memory cell has more than two states. The storage device 384 may include an optical storage drive, such as a DVD drive, and/or a hard disk drive (HDD).

Figure 9G:
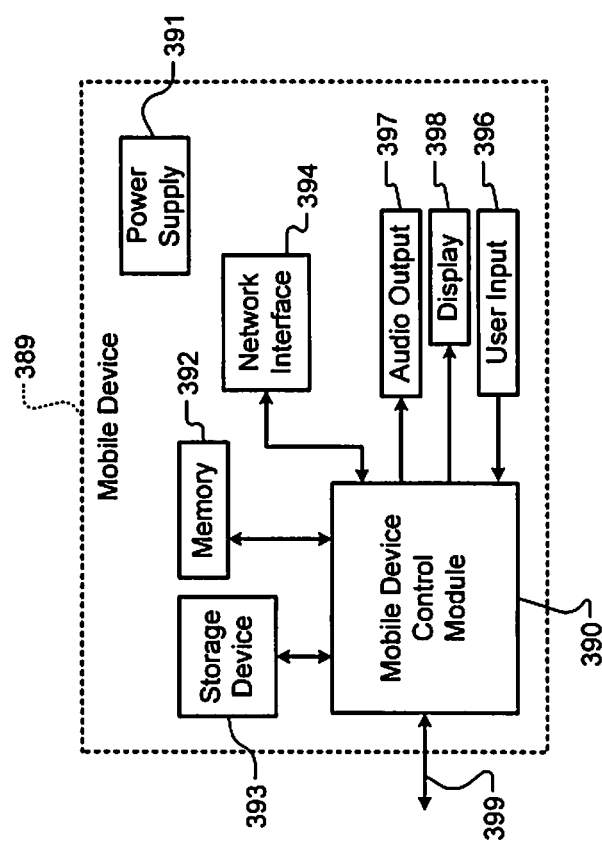
FIG. 9G is a functional block diagram of a mobile device.

Referring now to FIG. 9G, the teachings of the disclosure can be implemented in memory of a mobile device 389. The mobile device 389 may include a mobile device control module 390, a power supply 391, the memory 392, a storage device 393, a network interface 394, and an external interface 399. If the network interface 394 includes a wireless local area network interface, an antenna (not shown) may be included.

The mobile device control module 390 may receive input signals from the network interface 394 and/or the external interface 399. The external interface 399 may include USB, infrared, and/or Ethernet. The input signals may include compressed audio and/or video, and may be compliant with the MP3 format. Additionally, the mobile device control module 390 may receive input from a user input 396 such as a keypad, touchpad, or individual buttons. The mobile device control module 390 may process input signals, including encoding, decoding, filtering, and/or formatting, and generate output signals.

The mobile device control module 390 may output audio signals to an audio output 397 and video signals to a display 398. The audio output 397 may include a speaker and/or an output jack. The display 398 may present a graphical user interface, which may include menus, icons, etc. The power supply 391 provides power to the components of the mobile device 389. Memory 392 may include random access memory (RAM) and/or nonvolatile memory such as flash memory, phase change memory, or multi-state memory, in which each memory cell has more than two states. The storage device 393 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A memory system comprising:
an array of memory cells comprising redundant memory cells, wherein the redundant memory cells comprise (i) at least two redundant rows of memory cells, (ii) at least two redundant columns of memory cells, or (iii) a row of memory cells and a column of memory cells; and
a repair module configured to (i) identify at least two sets of memory cells of the array of memory cells, wherein each set of the at least two sets of memory cells includes a row of memory cells or a column of memory cells, and wherein each set of the at least two sets of memory cells includes non-operational memory cells, and (ii) substitute the at least two sets of the array of memory cells with selected rows or columns of the redundant memory cells based on X predetermined sequences of substitutions, where X is an integer greater than 1,
wherein the repair module is configured to
detect a failure in the array of memory cells that cannot be repaired using the X predetermined sequences of substitutions, and
use an alternative repair sequence to repair the non-operational memory cells based on the detection of the failure.

2. The memory system of claim 1, wherein the repair module is configured to detect the failure and the failure is a long term failure, wherein the long term failure is defined as occurring subsequent to a predetermined period of time.

3. The memory system of claim 1, wherein the a repair module, when substituting the at least two sets of memory cells with the selected rows or columns of the redundant memory cells based on the X predetermined sequences of substitutions, replaces rows and columns of the array of memory cells with selected rows or columns of the redundant memory cells in a predetermined order.

4. The memory system of claim 1, wherein the repair module is configured to:
when performing a first one of the X predetermined sequences of substitutions, replace in a first predetermined order (i) at least two rows of the array of memory cells, (ii) at least two columns of the array of memory cells, or (iii) a row of the array of memory cells and a column of the array of memory cells; and
when performing a second one of the X predetermined sequences of substitutions, replace in a second predetermined order (i) at least two rows of the array of memory cells, (ii) at least two columns of the array of memory cells, or (iii) a row of the array of memory cells and a column of the array of memory cells, and wherein the second predetermined order is different than the first predetermined order.

5. The memory system of claim 1, wherein the repair module is configured to replace one of (i) a row of the array of memory cells with one of the redundant rows of memory cells and (ii) a column of the array of memory cells with one of the redundant columns of memory cells, until one of the X predetermined sequences of substitutions repairs the array of memory cells.

6. The memory system of claim 1, wherein:
responsively to a determination that none of the X predetermined sequences of substitutions repairs the non-operational memory cells, the repair module uses the alternative repair sequence to repair the non-operational memory cells based on the determination; and
the alternative repair sequence is different than all of the X predetermined sequences of substitutions.

7. The memory system of claim 1, where the repair module is configured to, when performing the alternative repair sequence, replace rows and columns of the array of memory cells in an order that is different than orders of replacements implemented during the X predetermined sequences of substitutions.

8. The memory system of claim 1, wherein:
the repair module is configured to determine if the redundant memory cells are used to repair the non-operational memory cells; and
the repair module is configured to store information regarding valid replacements of the non-operational memory cells in unused ones of the redundant memory cells.

9. The memory system of claim 1, wherein:
the repair module is configured to use the alternative repair sequence to repair the non-operational memory cells using a soft repair, wherein the soft repair is a reversible repair; and
the repair module performs a hard repair based on the soft repair, wherein the hard repair is an irreversible repair.

10. A memory system, comprising:
an array of memory cells comprising redundant memory cells, wherein the redundant memory cells comprise (i) at least two redundant rows of memory cells, (ii) at least two redundant columns of memory cells, or (iii) a redundant row of memory cells and a redundant column of memory cells; and
a repair module configured to (i) identify at least two sets of memory cells of the array of memory cells, wherein each set of the at least two sets of memory cells includes a row of memory cells or a column of memory cells, and wherein each set of the at least two sets of memory cells includes non-operational memory cells, and (ii) substitute the at least two sets of the array of memory cells with selected rows or columns of the redundant memory cells based on X predetermined sequences of substitutions, where X is an integer greater than 1,
wherein the repair module is configured to
determine if the redundant memory cells are used to repair the non-operational memory cells, and
store information regarding valid replacements of the non-operational memory cells in unused ones of the redundant memory cells.

11. The memory system of claim 10, wherein the repair module is configured to determine which of ones of the X predetermined sequences of substitutions repair the non-operational memory cells and store the ones of the X predetermined sequences of substitutions as valid row and column combinations in the unused ones of the redundant memory cells.

12. The memory system of claim 10, wherein the repair module is configured to determine if all of the redundant memory cells are used to repair the non-operational memory cells and identify the unused ones of the redundant memory cells.

13. The memory system of claim 10, wherein the repair module is configured to store the information identifying replacements of the non-operational memory cells with ones of the redundant memory cells that result in a repair.

14. The memory system of claim 10, wherein the repair module is configured to store the information identifying operational memory cells.

15. The memory system of claim 10, wherein the repair module repairs the non-operational memory cells during a boot-up process based on the information.

16. The memory system of claim 15, wherein the repair module is configured to repair the non-operational memory using a soft repair, wherein the soft repair is a reversible repair.

17. The memory system of claim 16, wherein the repair module performs a hard repair based on the soft repair, wherein the hard repair is an irreversible repair.

18. The memory system of claim 10, wherein the repair module is configured to, when performing each of the X predetermined sequences of substitutions, replace rows and columns of the array of memory cells with selected ones of the redundant memory cells in a predetermined order.

19. The memory system of claim 18, wherein the repair module is configured to:
when performing a first one of the X predetermined sequences of substitutions, replace in a first predetermined order (i) at least two rows of the array of memory cells, (ii) at least two columns of the array of memory cells, or (iii) a row of the array of memory cells and a column of the array of memory cells; and
when performing a second one of the X predetermined sequences of substitutions, replace in a second predetermined order (i) at least two rows of the array of memory cells, (ii) at least two columns of the arrays of memory cells, or (iii) a row of the array of memory cells and a column of the array of memory cells, and
wherein the second predetermined order is different than the first predetermined order.

20. The memory system of claim 19, wherein the repair module is configured to replace one of (i) a row of the array of memory cells with one of the redundant rows of memory cells, and (ii) a column of the array of memory cells with one of the redundant columns of memory cells, until one of the X predetermined sequences of substitutions repairs the array of memory cells.

* * * * *